(12) United States Patent
Kasa et al.

(10) Patent No.: US 6,397,313 B1
(45) Date of Patent: May 28, 2002

(54) REDUNDANT DUAL BANK ARCHITECTURE FOR A SIMULTANEOUS OPERATION FLASH MEMORY

(75) Inventors: Yasushi Kasa, Cupertino; Guowei Wang, San Jose, both of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/632,390

(22) Filed: Aug. 4, 2000

Related U.S. Application Data
(60) Provisional application No. 60/160,353, filed on Oct. 19, 1999.

(51) Int. Cl.[7] .......................... G06F 12/06; G06F 11/20
(52) U.S. Cl. .................. 711/168; 711/103; 711/108; 714/8; 365/200; 365/230.03
(58) Field of Search .................. 711/103, 108, 711/168, 173; 714/6, 7, 8; 365/185.09, 185.11, 189.04, 200, 230.06, 230.03

(56) References Cited

U.S. PATENT DOCUMENTS

| | | | |
|---|---|---|---|
| 5,349,558 A | 9/1994 | Cleveland et al. | 365/200 |
| 5,694,359 A | 12/1997 | Park | 365/185.09 |
| 5,847,998 A | 12/1998 | Buskirk | 365/185.33 |
| 5,867,430 A | 2/1999 | Chen et al. | 365/189.04 |
| 6,005,803 A | 12/1999 | Kuo et al. | 365/185.11 |
| 6,006,313 A | 12/1999 | Fukumoto | 711/211 |
| 6,144,591 A * | 11/2000 | Vlasenko et al. | 365/200 |
| 6,172,916 B1 * | 1/2001 | Ooishi | 365/189.02 |
| 6,269,035 B1 * | 7/2001 | Cowles et al. | 365/200 |

FOREIGN PATENT DOCUMENTS

EP      0 797 145 A1      9/1997

\* cited by examiner

*Primary Examiner*—Do Hyun Yoo
*Assistant Examiner*—Gary J. Portka
(74) *Attorney, Agent, or Firm*—Wagner Murabito & Hao LLP

(57) ABSTRACT

The present invention discloses sector-based redundancy that is capable of making repairs using a plurality of redundant columns of memory cells in a dual bank memory device during simultaneous operation. The simultaneous operation memory device includes a plurality of redundant blocks that can be configured to be located in an upper bank or a sliding lower bank. The redundant blocks are comprised of sectors and each sector contains columns of memory cells. During simultaneous operation, the memory device is capable of reading the columns of memory cells in one bank and writing columns of memory cells in the other bank at the same time. In addition, the simultaneous operation memory device uses sector-based redundancy to repair columns of memory cells that are defective in one bank by electrically exchanging them with redundant columns of memory cells and, at the same time, repair columns of memory cells that are defective in the other bank. The dual bank sector-based redundancy includes a plurality of address CAM circuits that are configurably associated with the redundant blocks based on the bank location of the redundant blocks. The address CAM circuits are configured by a redundancy CAM read drain decoder circuit.

25 Claims, 10 Drawing Sheets

REDUNDANT DUAL BANK ARCHITECTURE FOR A SIMULTANEOUS OPERATION FLASH MEMORY

This application claims the benefit under 35 U.S.C. §119(e) of Provisional U.S. patent application Ser. No. 60/160,353, filed on Oct. 19, 1999, entitled "REDUNDANT DUAL BANK ARCHITECTURE FOR A SIMULTANEOUS OPERATION FLASH MEMORY."

FIELD OF THE INVENTION

The present invention is directed to the field of nonvolatile memory and, more particularly, to sector-based redundancy in a nonvolatile memory array configured in a dual bank architecture that is capable of performing simultaneous operation.

BACKGROUND

Computers, personal digital assistants, cellular telephones and other electronic systems and devices typically include processors and memory. The memory will be used to store instructions (typically in the form of computer programs) to be executed and/or data to be operated on by the processors to achieve the functionality of the device. In some applications, the systems and devices may require that the instructions and/or data be retained in some form of permanent/non-volatile storage medium so that the information is not lost when the device is turned off or power is removed. Exemplary applications include computer BIOS storage and diskless handheld computing devices such as personal digital assistants.

One type of non-volatile memory that can be used is flash Electrically Erasable Programmable Read Only Memory ("EEPROM") which is commonly referred to as a flash memory. Flash memory is a form of non-volatile storage, which uses a memory cell design with a floating gate. Voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material to remove electronic charge from the floating gate. Erasing a cell sets the logical value of the cell to "1" while programming the cell sets the logical value to "0".

Flash memory is typically divided logically into blocks called "sectors" where each sector contains a portion of the total bytes of data storage available. For example, a typical flash memory may have 32 megabits of total storage and be logically broken down into 64 sectors, each sector containing 64 kilobytes of data (one byte being equal to eight bits). This arrangement allows for the option of erasure of one sector at a time in addition to bulk erasure of the entire flash memory. Bye-bye-byte erasure is currently not possible although, depending on the implementation, data in the flash memory can be programmed and read byte by byte (or sometimes word by word, where a word equals four bytes).

Flash memory is manufactured to form rows and columns of memory cells that result in a memory array. The memory array is accessed by a row decoder (a wordline decoder) and a column decoder (a bitline decoder) that are used to address a particular memory cell or row of memory cells in the memory array. A sense amplifier is built into the flash memory for sensing the logic value of the selected memory cell(s) when addressed by the row decoder and column decoder. In recent years, the density of the memory array on a flash memory has increased dramatically. As the density of the memory array on a flash memory increases, it becomes significantly more difficult to produce perfect flash memory. During fabrication of the flash memory, it is common for the memory array to include one or more defective memory cells due to short circuits, open circuits and other operational defects. In an effort to improve production yields and flash memory reliability, spare or redundant memory cells are typically included on the flash memory so as to allow for repairing or replacing the defective memory cells in the memory array.

The flash memory is generally first tested to determine whether it operates properly while it is part of a semiconductor wafer joined with other flash memory. If a faulty area containing defective memory cells is located, redundant memory cells are substituted for the defective memory cells in the faulty area. Typically, circuitry is required for selectively deactivating the defective memory cells when repair is desired and for activating the redundant memory cells to effect the substitution. Since the flash memory is divided into sectors, the redundant memory cells are associated with one or more sectors such that defective memory cells within a sector are replaced by redundant memory cells associated with that particular sector.

The redundant memory cells and the memory cells are contained in a plurality of redundant blocks with each redundant block containing a plurality of the sectors. To allow repair of the defective memory cells by the redundant memory cells; an address of a column of defective memory cells is cross-referenced by the flash memory with the location of a column of redundant memory cells. The cross-referencing is accomplished by assigning an address storage location to the location of the column of redundant memory cells.

The address storage location is also assigned to a particular redundant block location. Column addresses of defective columns of memory cells that are stored in the particular address storage locations are located within the assigned redundant block location. The defective memory cells are repaired by the column of redundant memory cells that are assigned to the particular address storage location. The column address of the defective memory cells is stored in the address storage location and later compared against a column address of memory cells that are active within the flash memory during operation. If the addresses match, replacement of the active column of memory cells with a column of redundant memory cells occurs.

A problem arises when the redundant blocks within the flash memory can be selectively configured into different locations. Since the address storage locations are assigned to the redundant block locations, additional address storage locations are required to account for the different possible redundant block locations. However, only the address storage locations where the redundant block is located will be used while the additional address storage remain idle.

The increased circuitry caused by the increase in address storage locations reduces the area available for flash memory cells as well as increases the power consumed by the flash memory. In addition, in the prior art only one column of defective memory cells can be repaired at a time. Therefore, if the flash memory is capable of simultaneously performing tasks in redundant blocks in different locations, the redundancy may slow down operation of the flash memory while a redundant block in one location waits for a redundant block in the other location to complete a repair.

SUMMARY

By way of introduction, this invention relates generally to floating gate memory devices such as an array of flash electrically erasable programmable read-only memory (EEPROM) cells with sector-based redundancy. More particularly, the present invention relates to sector-based redundancy for an array of flash EEPROM cells in a sliding bank configuration that is referred to as a simultaneous operation flash memory.

The simultaneous operation flash memory is divided into an upper bank and a sliding lower bank and provides for reading in one bank while simultaneously performing a program or erase operation in the other bank. The simultaneous operation flash memory uses a sliding bank architecture that allows the user to vary the megabit density of the upper bank and the sliding lower bank by designating whether a plurality of redundant blocks (b0–b7) will be located in the upper bank or the sliding lower bank. Within each redundant block (b0–b7) is a plurality of sectors containing a plurality of columns of memory cells and a plurality of rows of memory cells that form the memory array. The plurality of sectors also include a plurality of columns and rows of redundant memory cells.

The presently preferred simultaneous operation flash memory includes sector-based redundancy that is capable of repairing a column of memory cells that is defective in the upper bank and repairing a column of memory cells that is defective in the sliding lower bank at the same time. This "two-way" sector-based redundancy can simultaneous repair a column of defective memory cells in both the upper and sliding lower bank within the memory array using the columns of redundant memory cells. In addition, the sector-based redundancy is configurable to use the same storage locations for respective redundant blocks (b0–b7) that are configured to be located in the upper bank or the sliding lower bank.

The presently preferred embodiment includes a repair select decoder circuit, a redundancy CAM read drain decoder circuit, a plurality of address CAM circuits, a plurality of comparator circuits and a plurality of control logic circuits. During testing of the simultaneous operation flash memory, the user identifies columns of memory cells that are defective in the sectors of the redundant blocks (b0–b7) that are located in either the upper bank or the sliding lower bank. The user enters a repair mode and selects the columns of redundant memory cells associated with that memory sector to replace the columns of memory cells that are defective, thereby making a repair.

The columns of memory cells that are defective are not physically replaced, instead a sector-based address where a defective column of memory cells is located is stored in a particular storage location within the address CAM circuits. The storage locations within the address CAM circuits are configurable to remain assigned to a particular redundant block (b0–b7) that can be located in either the upper bank or the sliding lower bank. In addition, the storage locations within the address CAM circuits are assigned to the columns of redundant memory cells within each sector. Therefore, by storing the sector-based address of a column of memory cells that is defective in the particular storage location, the redundant block (b0–b7) when the defective column of memory cells are located and the redundant columns of memory cells within that redundant block (b0–b7) are identified.

During operation, the simultaneous operation flash memory will compare the upper bank or the sliding lower bank sector-based column address of an active column of memory cells with the sector-based addresses stored in the address CAM circuits. The active column of memory cells is a column of memory cells being accessed to perform a read or write. Comparison of the active column of memory cells and the sector-based addresses is accomplished with the redundancy CAM read drain decoder circuit.

The redundancy CAM read drain decoder circuit decodes a bank location of the redundant block (b0–b7) where the sector containing the column of active memory cells is located. The bank location refers to the location of the redundant blocks (b0–b7) in either the upper bank or the sliding lower bank. The redundancy CAM read drain decoder then reads the address CAM circuits assigned to that redundant block (b0–b7) to provide the stored sector-based address information to upper bank comparator circuits or lower bank comparator circuits depending on which bank (upper or lower) the redundant block (b0–b7) is located in. If the upper bank or lower bank comparator circuits compare and determine that the stored sector-based address information and the sector-based address of the active column of memory cells match, upper bank control logic circuits or lower bank control logic circuits are activated.

The upper bank control logic circuits or the lower bank control logic circuits disable the columns of defective memory cells in all the sectors and enables the columns of redundant memory cells in all the sectors in the respective redundant block (b0–b7). The simultaneous operation flash memory is effectively repaired when the defective memory cells are electrically exchanged with the redundant memory cells. Repairs occur during the performance of the read or write by the simultaneous operation flash memory. The operation of the redundancy CAM read drain decoder circuit allows the address CAM circuits in both the upper and sliding lower banks to be read regardless of the sliding bank configuration of the redundant blocks (b0–b7) within the simultaneous operation flash memory. Since the sector-based redundancy independently operates in the upper bank and the sliding lower bank, a column of memory cells that is defective can be electrically exchanged in the sliding lower bank at the same time a different column of memory cells that is defective is electrically exchanged in the upper bank.

These and other features and advantages of the invention will become apparent upon consideration of the following detailed description of the presently preferred embodiments of the invention, viewed in conjunction with the appended drawings.

DETAILED DESCRIPTION

The exemplary embodiments of the present invention are set forth below with reference to specific configurations, and those skilled in the art would recognize that various changes and modifications could be made on the specific configurations while remaining within the scope of the claims. The invention may be used with any type of multiple bank memory device requiring redundancy; however, the preferred embodiment of the invention is designed for flash memory. All electrical parameters are given by example and can be modified for use with various memory devices using other electrical parameters.

The present invention discloses a flash memory for reading while simultaneously undergoing a program or erase operation. The flash memory according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen, et al. and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of simultaneous operation flash memory.

Figure 1:
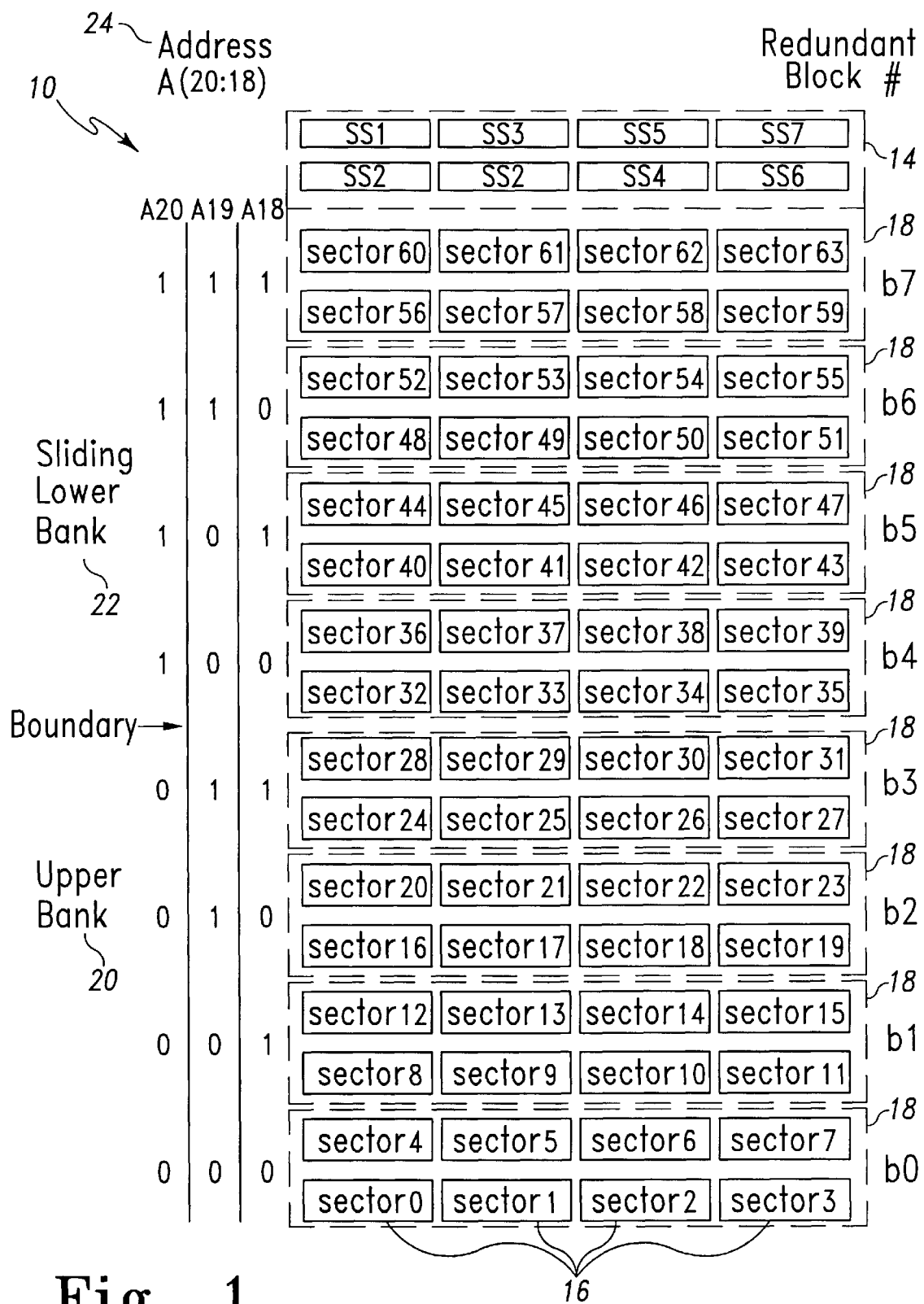
FIG. 1 represents a block diagram of a sector array architecture of the presently preferred simultaneous operation flash memory.

FIG. 1 illustrates a block diagram of a portion of a preferred simultaneous operation flash memory 10 that includes sector-based redundancy. The sector-based redundancy allows repair of columns of defective memory cells with redundant columns of memory cells on a sector-by-sector basis. U.S. Pat. No. 5,349,558 entitled "SECTOR-BASED REDUNDANCY ARCHITECTURE," to Cleveland, et al. discloses a sector-based redundancy architecture using an eight-bit array of flash EEPROM cells that is herein incorporated by reference in its entirety. The preferred embodiment of the present invention relates to a sector-based redundancy as applied to the simultaneous operation flash memory 10. By way of introduction, a discussion of the configuration and operation of the simultaneous operation flash memory 10 is provided to facilitate an understanding of the application of sector-based redundancy with regard to the present invention.

The preferred simultaneous operation flash memory 10 illustrated in FIG. 1 includes a plurality of sectors (s0–s63) 12 and a plurality of small sectors (ss0–ss7) 14 that form a plurality of sector blocks 16 and a plurality of redundant blocks 18. As known in the art, each sector 12 and small sector 14 includes a plurality of memory cells arranged in rows and columns. In the presently preferred embodiment, the sectors 12 are preferably designed as five-hundred-twelve kilobit sectors and each small sector 14 is designed as a sixty-four kilobit sector. Accordingly, the sectors 12 combine to form a thirty-two megabit simultaneous operation flash memory 10 in the presently preferred embodiment. The present invention could be applied to various memory sizes and the thirty-two megabit density set forth in the preferred embodiment should not be construed as a limitation.

Referring to FIG. 1, for the purpose of the present preferred embodiment, a row of sectors 12 is referred to herein as a sector block 16. As such, four sectors 12 in a row are in each sector block 16. In the presently preferred embodiment illustrated in FIG. 1, there are sixteen sector blocks 16 in the simultaneous operation flash memory 10. In addition, the presently preferred simultaneous operation flash memory 10 includes a plurality of redundant blocks (b0–b7) 18, each redundant block (b0–b7) 18 being associated with a group of two consecutive sector blocks 16, or eight sectors 12, as further illustrated in FIG. 1.

The presently preferred embodiment is designed for simultaneous operation flash memory 10 with a sliding bank architecture. The sliding bank architecture is divided into two banks, an upper bank 20 and a sliding lower bank 22. The sectors 12 can be configurably located in the upper bank 20 or the sliding lower bank 22. The number of sectors 12 located in each respective bank 20, 22 determines the amount of storage capacity in the upper bank 20 and sliding lower bank 22. As illustrated in FIG. 1, in the preferred embodiment, the simultaneous operation flash memory 10 can be divided by bank boundaries to form a 16-megabit upper bank and a 16-megabit sliding lower bank (option 0), a 24-megabit upper bank and an 8-megabit sliding lower bank (option 1), a 28-megabit upper bank and a 4-megabit sliding lower bank (option 2) or a 31.5-megabit upper bank and a 0.5-megabit sliding lower bank (option 3). For the purposes of the present preferred embodiments, the small sectors 14 are advantageously considered to fall within the sliding lower bank 22. The bank boundaries are not limited to those illustratively set forth in the presently preferred embodiments.

The distribution of the storage capacity of the simultaneous operation flash memory 10 within the upper bank 20 and the sliding lower bank 22 is determined by customer demands during fabrication. Users of simultaneous operation flash memory 10 may need different bank partition sizes depending on their applications. The sliding bank architecture allows the simplified design and manufacture of simultaneous operation flash memory 10 with varied bank boundaries, as set forth above. To alter the bank boundary, a single metal layer of the simultaneous operation flash memory 10 is altered.

Simultaneous operation flash memory 10 uses sliding bank architecture because it gives the device the ability to simultaneously perform a read and write function in respective banks 20, 22. As such, if a read operation is being performed in the upper bank 20, a write operation may simultaneously be performed in the sliding lower bank 22. This is because write operations often take considerably longer than read operations thereby allowing read operations to be performed on the bank 20, 22 that is not undergoing a programming or erasing operation.

Application of sector-based redundancy to the simultaneous operation flash memory 10 using the presently preferred embodiment allows repairs to occur during simultaneous operation. The repair of defective columns of memory cells in the individual sectors 12 within each redundant block (b0–b7) 18 occur using storage locations that are programmed to associate a redundant column of memory cells with a defective column of memory cells. The storage locations can be programmed to make the association whether the redundant block (b0–b7) 18 is in the upper bank 20 or the sliding lower bank 22. To filly understand how these repairs occur, an understanding of the addressing of the simultaneous operation flash memory 10 is helpful.

The upper bank 20 and the sliding lower bank 22 are independent banks. The upper bank 20 includes an upper address (UA) wordline decoder (not shown) and a UA bitline decoder (not shown) that are used to access the memory cells within the sectors 12 in the upper bank 20. The sliding lower bank 22 similarly includes a lower address (LA) wordline decoder (not shown) and a LA bitline decoder (not shown) to access the memory cells within the sectors 12 in the sliding lower bank 22. In the presently preferred embodiment, the UA and LA wordline decoders decode a portion of a twenty-one bit address that identifies a sector 12, a sector block 16 and a sector-based address of a wordline of memory cells (not shown) within the sector 12. The UA and LA bitline decoders decode another portion of the twenty-one bit address that is a sector-based address that identifies a bitline of memory cells (not shown) within the sector 12.

The twenty-one bit addresses also identify a bank location of the particular redundant block (b0–b7) 18 in which the sector 12 and the sector block 16 are located. In the presently disclosed embodiments, each of the redundant blocks (b0–b7) 18 will be located in the upper bank 20 or the sliding lower bank 22 depending on the bank partition size chosen during fabrication. In the presently preferred embodiment illustrated in FIG. 1, redundant blocks (b0–b3) 18 are located in the upper bank 20 and redundant blocks (b4–b7) 18 are located in the sliding lower bank 22. The redundant blocks (b0–b7) 18 are decoded with a plurality of redundant block address lines (A(20)–A(18)) 24. A redundant block address provided on the redundant block address lines (A(20)–A(18)) 24 represents the most significant bits of the twenty-one bit address. In general, addressing occurs whenever memory cells are being accessed by the simultaneous operation flash memory 10. The number of bits in an address can vary in alternative embodiments of the present invention.

In general, using the bank boundaries established during fabrication, an address buffer (not shown) multiplexes the parts of the twenty-one bit addresses to the respective UA and LA wordline and bitline decoders for the selected bank 20, 22. The address buffer decodes the twenty-one bit addresses to identify the bank 20, 22 where the columns of memory cells are located. In addition, the address buffer provides the UA or LA wordline and bitline decoders with the addresses to access the memory cells within the sectors 12.

Figure 2:
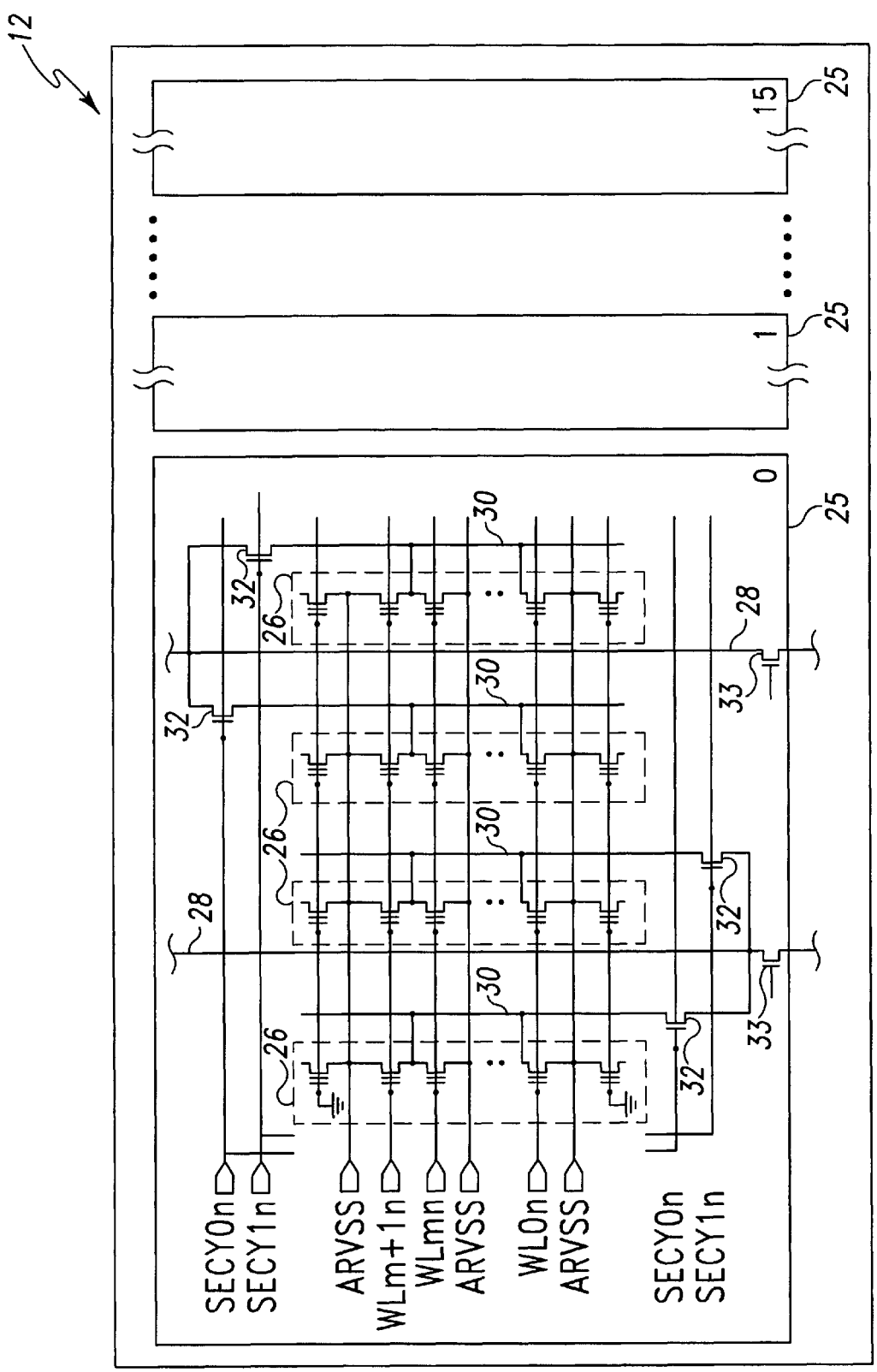
FIG. 2 is a schematic diagram of a portion of a sector array architecture of the presently preferred simultaneous operation flash memory.

FIG. 2 illustrates a schematic of a portion of a sector 12. In the presently preferred embodiment, each sector 12 includes sixteen I/O blocks (I/O 0–I/O 15) 25 that include a plurality of columns of memory cells 26, a plurality of metal2 bitlines 28, a plurality of metal1 bitlines 30, a plurality of metal1 sector select transistors 32 and a plurality of metal2 bitline select transistors 33. The columns of memory cells 26 within each I/O block (I/O 0–I/O 15) 25 are electrically connected with the metal2 bitlines 28, the metal1 bitlines 30, the metal1 sector select transistors 32 and the metal2 bitline select transistors 33 as shown in FIG. 2.

In the presently preferred embodiment, there are sixty-four metal1 bitlines 30 per I/O block (I/O 0–I/O 15) 25 that are electrically connected to thirty-two respective metal2 bitlines 28. The data contained in a respective column of memory cells 26 is accessed by electric signals received from the UA or LA wordline decoder and the UA or LA bitline decoder. The UA or LA wordline decoder supplies electric signals on the control gate of a respective metal1 sector select transistor 32. The UA or LA bitline decoder supplies electric signals on the control gate of a respective metal2 bitline select transistor 33. The metal1 sector select transistors 32 and the metal2 bitline select transistors 33 operate to isolate and allow independent use of the columns of memory cells 26 residing within the respective sector 12. The electric signals activate the respective transistors thereby selecting a particular sector 12 and a particular bitline within the sector 12 to allow access to the data contained in respective columns of memory cells 26 in each of the I/O blocks (I/O 0–I/O 15) 25.

The UA and LA wordline decoders utilize the metal1 sector select transistors 32 to divide the columns of memory cells 26 into segments that represent the different sectors 12. The UA and LA bitline decoders use the metal2 bitline select transistors 33 to activate the metal2 bitlines 28. Each metal2 bitline 28 within the I/O blocks (I/O 0–I/O 15) 25 is identified with a respective sector-based address. As such, when a sector-based address is decoded by the UA and LA bitline decoders as previously set forth, respective metal2 bitlines 28 within each I/O block (I/O 0–I/O 15) 25 are activated.

The sixteen I/O blocks (I/O 0–I/O 15) 25 that are located in each sector 12 are separated into a high byte and a low byte of data, whereby I/O blocks (I/O 0–I/O 7) 25 comprise the low byte and I/O blocks (I/O 8–I/O 15) 25 comprise the high byte. In the presently preferred embodiment, the simultaneous operation flash memory 10 is capable of operating in sixteen-bit or eight-bit mode. In sixteen-bit mode, the simultaneous operation flash memory 10 operates with sixteen bits of data; and in eight-bit mode, the simultaneous operation flash memory 10 operates with eight bits of data. The number of I/O blocks (I/O 0–I/O 15) 25, columns of memory cells 26, metal2 bitlines 28 and metal1 bitlines 30 are not limited to those quantities illustratively set forth and could be increased or decreased in different simultaneous operation flash memory 10 designs.

Figure 3:
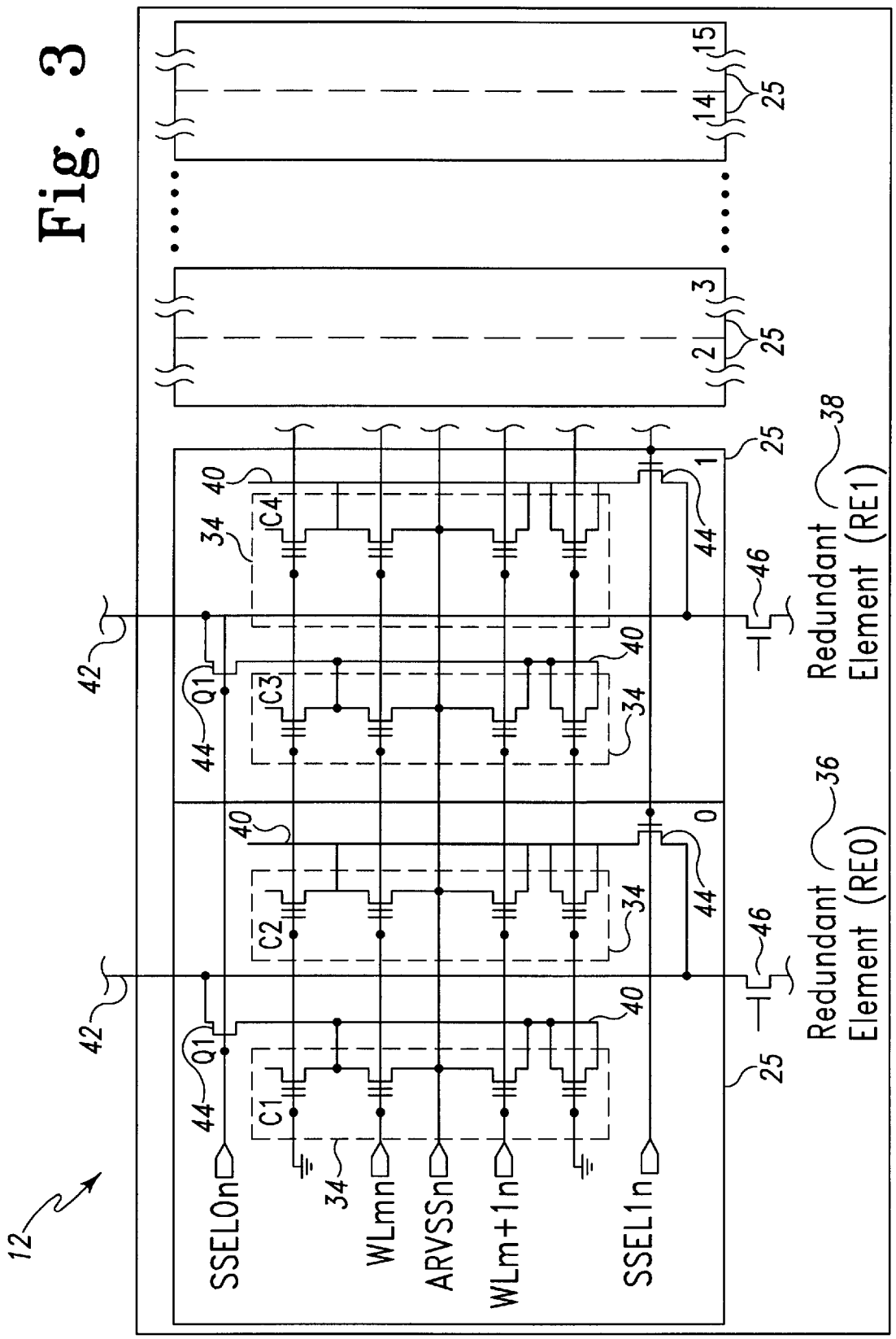
FIG. 3 is a schematic diagram of a portion of a redundant sector array architecture of the presently preferred simultaneous operation flash memory.

Referring to FIG. 3, the preferred simultaneous operation flash memory 10 also includes a plurality of redundant columns of memory cells 34 within each respective sector 12. The redundant columns of memory cells 34 are used to repair defects in the columns of memory cells 26 illustrated in FIG. 2. In the preferred simultaneous operation flash memory 10, the redundant columns of memory cells 34 are either located in a first redundant element (RE0) 36 or a second redundant element (RE1) 38. As illustrated in FIG. 3, each redundant element 36, 38 includes a plurality of metal1 redundant bitlines 40, a plurality of metal2 redundant bitlines 42, a plurality of redundant metal1 sector select transistors 44 and a plurality of redundant metal2 bitline select transistors 46 electrically connected as illustrated.

As further illustrated in FIG. 3, each respective redundant column of memory cells 34 is electrically connected to a respective metal1 redundant bitline 40, which is in turn, electrically connected with a respective metal2 redundant bitline 42. In the presently preferred embodiment, there are two metal2 redundant bitlines 42 that are shared between two I/O blocks (I/O 0–I/O 15) 25 to create a total of sixteen metal2 redundant bitlines 42 per sector 12. As such, in the presently preferred embodiment, there are a total of thirty-two redundant columns of memory cells 34 located in each respective sector 12.

In the presently preferred embodiment, the first redundant element (RE0) 36 and the second redundant element (RE1) 38 each include a group of eight metal2 redundant bitlines 42. As such, since there are sixteen I/O blocks (I/O 0–I/O 15) 25 per sector 12, I/O blocks (I/O 0, I/O 2, I/O 4, I/O 6, I/O 8, I/O 10, I/O 12, I/O 14) 25 can be, for example, associated with the first redundant element (RE0) 36 and I/O blocks (I/O 1, I/O 3, I/O 5, I/O 7, I/O 9, I/O 11, I/O 13, I/O 15) 25 can be, for example, associated with the second redundant element (RE1) 38.

The sector-based redundancy of the preferred embodiment of the present invention includes a plurality of redundant UA bitline decoders (not shown) and a plurality of redundant LA bitline decoders (not shown). The redundant UA and LA bitline decoders decode the redundant elements 36, 38 within the sectors 12 in the upper bank 20 or the sliding lower bank 22, respectively. In general, the redundant UA and LA bitline decoders decode the redundant elements 36, 38 within the sectors 12 to repair defects in the columns of memory cells 26.

In the presently preferred embodiment, there is not a separate wordline decoder to decode the sector 12, sector block 16, and the sector-based address of the rows of redundant memory cells. Instead, the rows of redundant memory cells are decoded by the UA wordline decoders (not shown) and LA wordline decoders (not shown) in the manner previously set forth for the non-redundant rows of memory cells. As such, the redundant metal1 sector select transistors 44 are electrically connected with the UA and LA wordline decoders.

The redundant metal1 sector select transistors 44 and the redundant metal2 bitline select transistors 46 are decoded in the same manner as the metal1 sector select transistors 32 and the metal2 bitline select transistors 33, respectively, set forth in FIG. 2. Similarly, the redundant metal1 sector select transistors 44 and the redundant metal2 bitline select transistors 46 operate to isolate and allow independent use of the redundant columns of memory cells 34 within the sector 12. The UA wordline decoders and the LA wordline decoders utilize the metal1 redundant sector select transistors 44 to divide the redundant columns of memory cells 34 into different segments or redundant blocks. An individual segment residing within the particular sector 12 can be made independent from other segments in the same column and can thus be used to replace or repair a different defect. In the presently preferred embodiment, the redundant metal2 bitline select transistors 46 are decoded by the redundant LA bitline decoders (not shown) and the UA bitline decoders (not shown).

Figure 4:
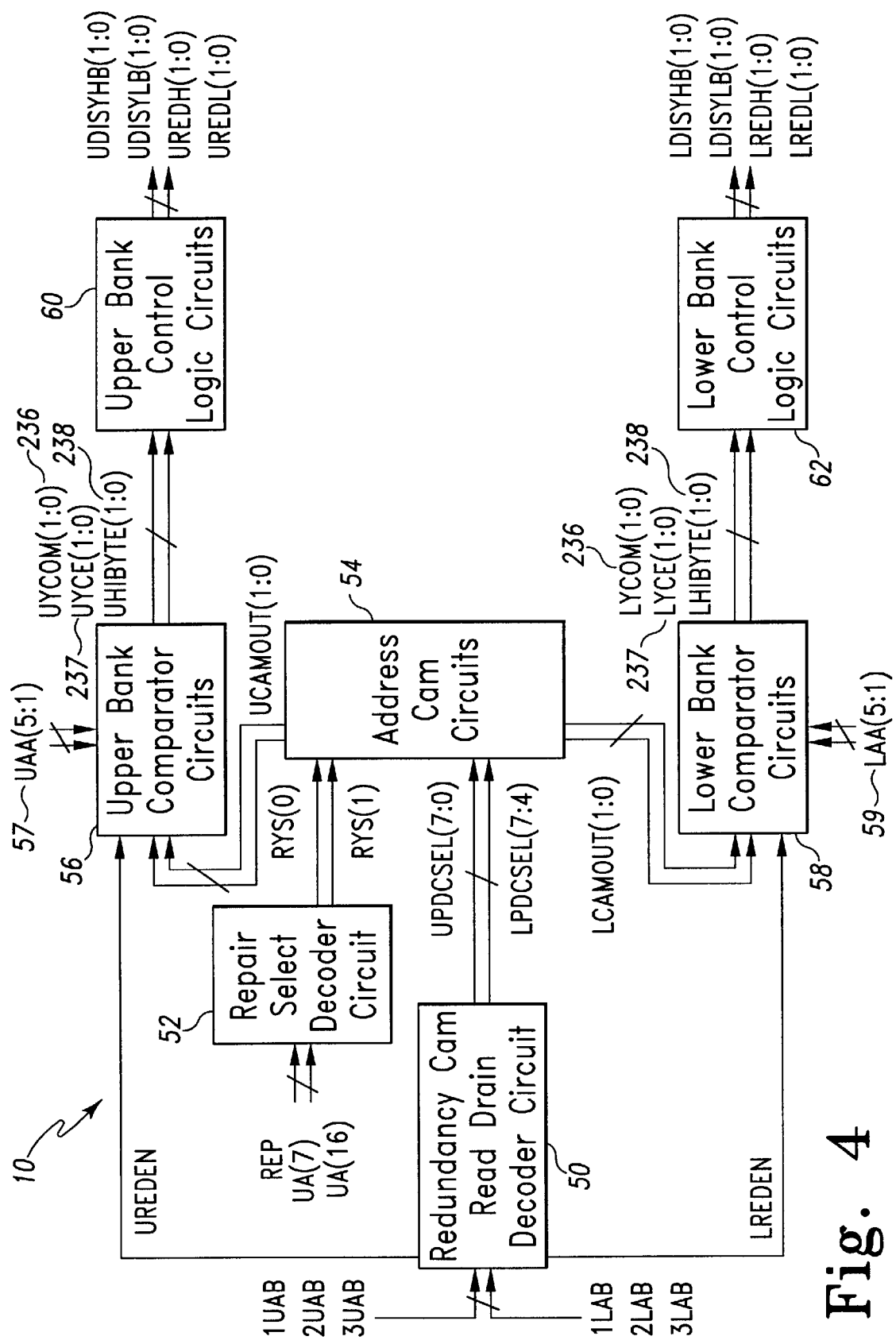
FIG. 4 represents a block diagram of a portion of a presently preferred simultaneous operation flash memory incorporating the presently disclosed sector-based redundancy.

FIG. 4, illustrates a block diagram of a portion of the preferred simultaneous operation flash memory 10 that illustrates the circuits that comprise the sector-based redundancy. As previously set forth, the sector-based redundancy provides for the electrical replacement of the columns of memory cells illustrated in FIG. 2 with the redundant columns of memory cells illustrated in FIG. 3. The preferred sector-based redundancy includes a redundancy CAM read drain decoder circuit 50, a repair select decoder circuit 52, a plurality of address CAM circuits 54, a plurality of upper bank comparator circuits 56, a plurality of lower bank comparator circuits 58, a plurality of upper bank control logic circuits 60 and a plurality of lower bank control logic circuits 62 electrically connected as illustrated in FIG. 4.

The presently preferred embodiments also provide "two-way" redundancy within the simultaneous operation flash memory 10 by providing repair of defects in the upper bank 20 and the sliding lower bank 22. "Two-way" redundancy is defined as the capability to make repairs in one bank that is being read while also making repairs in the other bank that is being written. When a column of memory cells 26 in a sector 12 is identified as defective during testing, the column of memory cells 26 that is defective is replaced by a redundant column of memory cells 34 that is associated with the same sector 12. The repair occurs by electrically exchanging the column of memory cells 26 that is defective with the redundant column of memory cells 34. Within the sector-based redundancy of the preferred simultaneous operation flash memory 10, when a column of memory cells 26 that is defective is programmed to be electrically exchanged with a redundant column of memory cells 34, the electrical exchange occurs for all the sectors 12 in the redundant block (b0–b7) 18.

To implement the electrical exchange, the sector-based address of the column of memory cells 26 that is defective is programmed into the address CAM circuits 54 during a repair mode. During programming, the redundancy CAM read drain decoder circuit 50 decodes the redundant block address lines (A(20)–A(18)) 24 of the column of memory cells 26 that is defective. As previously set forth, the redundant block address is provided by the address buffer and identifies whether the redundant block (b0–b7) 18 containing the column of memory cells 26 that is defective is located in the upper bank 20 or the sliding lower bank 22, respectively.

The repair select decoder circuit 52 is directed by a plurality of predetermined inputs received during the repair mode to select the first redundant element (RE0) 36 or the second redundant element (RE1) 38 to perform the repair within the given sector 12. As previously set forth, the first and second redundant elements 36, 38 form a byte consisting of eight redundant columns of memory cells 34. Therefore, a byte containing eight columns of memory cells 26, that includes the column of memory cells 26 that is defective, are electrically exchanged during the repair. The first redundant element (RE0) 36 and the second redundant element (RE1) 38 can be used to repair either a low byte located within I/O blocks (I/O0–I/O7) 25 or a high byte located within I/O blocks (I/O 8–I/O 15) 25 as is hereinafter described.

The location in the upper bank 20 or the sliding lower bank 22 of a particular redundant block (b0–b7) 18 and the selection of the appropriate redundant element 36, 38 enables a plurality of storage locations (not shown) within the address CAM circuits 54 to be programmed. Each storage location within the address CAM circuits 54 is assigned to either the first redundant element (RE0) 36 or the second redundant element (RE1) 38. In addition, each storage location is assigned to a respective redundant block (b0–b7) 18 so that only the sector-based addresses of columns of memory cells 26 that are located in the respective redundant block (b0–b7) 18 will be stored. When the sector-based address of the column of memory cells 26 that is defective is stored in the selected storage location within the address CAM circuits 54, the column of memory cells 26 that is defective is assigned to be repaired by either the first redundant element (RE0) 36 or the second redundant element (RE1) 38. The first or second redundant element 36, 38 is located in the same redundant block (b0–b7) 18 where the column of memory cells 26 that is defective is located.

During operation when a read or a write is performed within the simultaneous operation flash memory 10, the sector-based address of an active column of memory cells within a sector 12 is supplied to the upper or lower bank comparator circuit 56 or 58 respectively by the address buffer. The active column of memory cells is the column of memory cells 26 that the simultaneous operation flash memory 10 is currently accessing during a read or a write in one of the redundant blocks (b0–b7) 18 in either the upper bank 20 or the sliding lower bank 22. The sector-based address of the active column of memory cells is provided to the upper bank comparator circuits 56 or the lower bank comparator circuits 58 by the address buffer depending on the bank location of the redundant block (b0–b7) 18 containing the active column of memory cells. The bank location of the redundant block (b0–b7) 18 is in the upper bank 20 or the sliding lower bank 22.

At the same time, the redundancy CAM read drain decoder circuit 50 receives the redundant block address generated by the address buffer on the redundant block address lines ((A20)–(A18)) 24. The redundancy CAM read drain decoder circuit 50 decodes the redundant block address lines ((A20)–(A18)) 24 to identify whether the active column of memory cells is in the upper bank 20 or sliding lower bank 22. The redundancy CAM read drain decoder circuit 50 then selectively activates the address CAM circuits 54 to read the storage locations that are assigned to the redundant block (b0–b7) 18 where the active column of memory cells is located.

During the operation, the upper or lower bank comparator circuits 56 or 58, compare the sector-based address of the active column of memory cells with the sector-based addresses stored in the storage locations. If the sector-based addresses match one of the sector-based addresses stored in the address CAM circuits 54, the active column of memory cells contains defective memory cells. The defective memory cells were previously identified during testing and were repaired by the first redundant element (RE0) 36 or the second redundant element (RE1) 38. When the addresses match, the upper bank comparator circuits 56 or the lower bank comparator circuits 58 activate either the upper bank control logic circuits 60 or the lower bank control logic circuits 62. As previously set forth, the use of the sector-based redundancy associated with the upper bank 20 or the sliding lower bank 22 is dependent on which bank the redundant block (b0–b7) 18 containing the column of memory cells 26 that is defective is located within. The upper or lower bank control logic circuits 60, 62 are used to deactivate the UA bitline decoder (not shown) or the LA bitline decoder (not shown), respectively, that is decoding a byte in the sector 12 containing the column of memory cells 26 that is defective. The upper or lower bank control logic circuit 60, 62, respectively, also activates the UA redundant bitline decoder (not shown) or the LA redundant bitline decoder (not shown), respectively, that will decode the first redundant element (RE0) 36 or the second redundant element (RE1) 38. The first redundant element (RE0) 36 or the second redundant element (RE1) 38 is electrically exchanged with the byte of columns of memory cells 26 that includes the column of memory cells 26 that is defective thereby repairing the simultaneous operation flash memory 10. Since the UA or LA wordline decoders are decoding the sector-based address of the row that includes the first and second redundant elements 36, 38 as well as the byte of memory cells that includes the column of memory cells 26 that is defective, the read or write is performed on the selected redundant element 36, 38 by the simultaneous operation flash memory 10.

The upper and sliding lower bank 20, 22, respectively, have independently operating sector-base redundancy. Accordingly, the repair of columns of memory cells 26 that are defective can occur at the same time in the banks 20, 22 during operation of the simultaneous flash memory 10. This "two-way" redundancy scheme is controlled by the redundancy CAM read drain decoder circuit 50. Since the sector-based addresses stored in the address CAM circuits 54 are associated with one of the redundant blocks 18 that is located in either the upper bank 20 or the sliding lower bank 22, there will not be any conflicts when both banks 20, 22 are being repaired at the same time.

The foregoing provides an illustrative overview of the sector-based redundancy as applied to the simultaneous operation flash memory 10. A detailed discussion of the configuration and operation of each of the circuits of the presently preferred embodiment is provided below.

Redundancy CAM Read Drain Decoder Circuit

Figure 5:
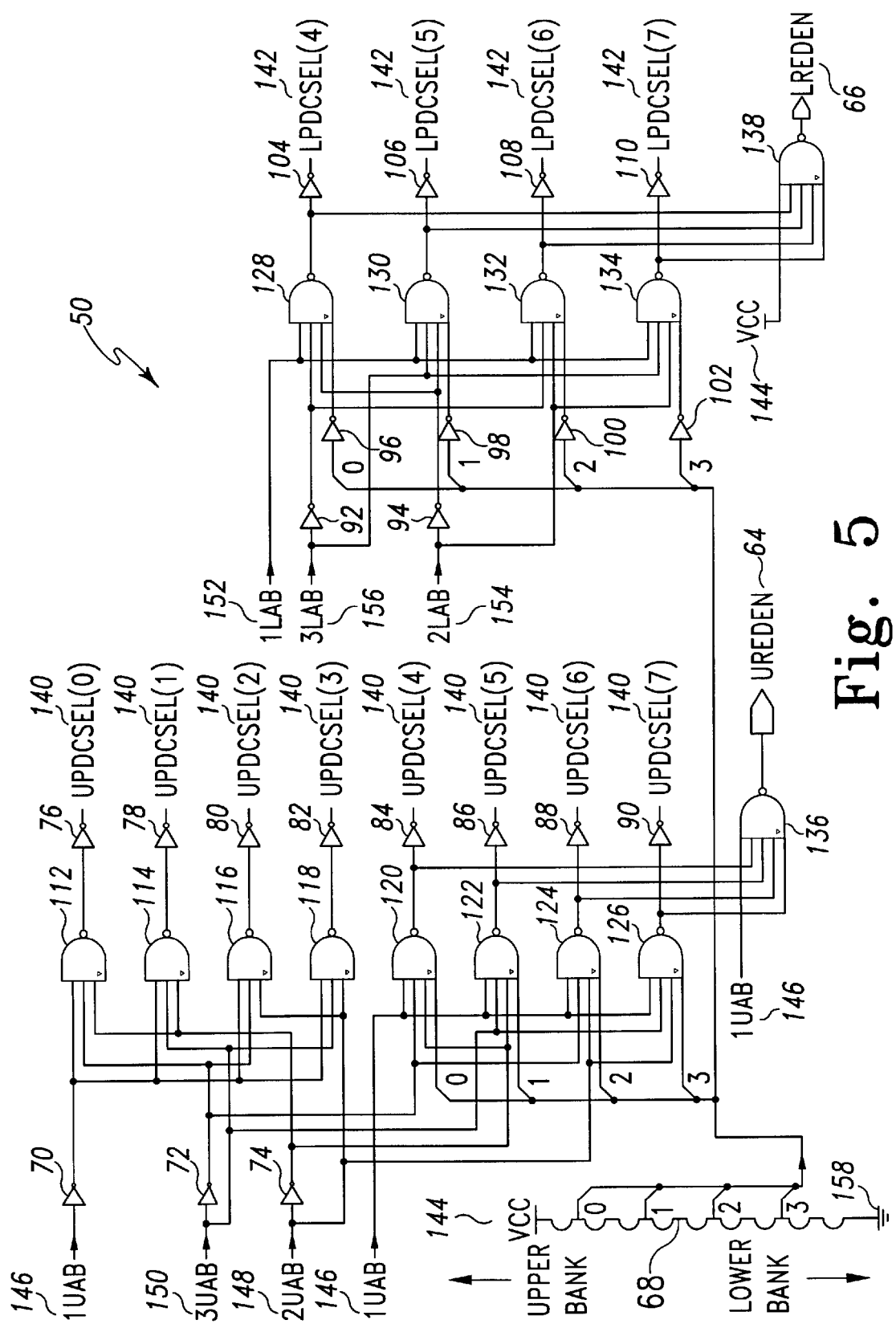
FIG. 5 is a schematic diagram of the redundancy CAM read drain decoder circuit illustrated in FIG. 4.

FIG. 5 illustrates a schematic of the presently preferred redundancy CAM read drain decoder circuit 50 that includes a bank boundary select 68; a plurality of inverters 70–110 and a plurality of NAND gates 112–138 electrically connected as illustrated. As previously set forth, the redundancy CAM read drain decoder circuit 50 decodes the address storage locations within the address CAM circuits 54. The redundancy CAM read drain decoder circuit 50 is active in the repair mode and also during operation of the simultaneous operation flash memory 10.

During the repair mode programming of a sector-based address of a column of memory cells 26 that is defective, the redundant block address lines ((A20)–(A18)) 24 provide electric signals representing redundant block addresses to the redundancy CAM read drain decoder circuit 50. Redundant block address line (A20) 24 is provided to a first upper address bit (UAB) input 146 or a first lower address bit (LAB) input 152, redundant block address line (A18) 24 is provided to a third UAB input 150 or a third LAB input 156. Redundant block address line (A19) 24 is provided to a second UAB input 148 or a second LAB input 154. As previously set forth, the designation of the redundant block address ((A20)–(A18)) 24 as being in the upper bank 20 or sliding lower bank 22 is accomplished by the address buffer.

The configuration of the banks 20, 22 in the sliding bank architecture also determines the configuration of the redundancy CAM read drain decoder circuit 50. In the presently preferred embodiment, as previously set forth, there are at least four bank boundary options available. When a bank boundary option is chosen during fabrication, the bank boundary select 68 is cut to correspond to the option chosen. The configuration of the bank boundary select 68 also configures signal outputs one, two, three and four to be conducting (logic "1") or non-conducting (logic "0"). For example, if bank boundary option two is selected, the bank boundary select 68 is cut such that signal output line three from the bank boundary select 68 is electrically connected to a ground connection 158 and signal outputs lines zero, one and two from the bank boundary select 68 are electrically connected to a supply voltage (Vcc)144.

In the preferred embodiment of the present invention, NAND gates 112–126 are associated with redundant blocks (b0–b7) 18, respectively, in the upper bank 20 and NAND gates 128–134 are associated with redundant blocks (b4–b7) 18, respectively, in the sliding lower bank 22. When a redundant block address from the address buffer is provided to the redundancy CAM read drain decoder circuit 50, only one of the outputs of the plurality of NAND gates 112–134 will be non-conducting. The outputs from the respective NAND gates 112–134 are then inverted with a respective inverter 76–90, 104–110. The outputs are then supplied to a respective upper select output line (UPDCSEL(7:0)) 140 or a lower select output line (LPDCSEL(7:4)) 142 that is associated with a particular redundant block (b0–b7) 18 in either the upper bank 20 or the sliding lower bank 22. The notation "(7:0)" and "(7:4)" represent eight and four upper and lower select output lines 140, 142, respectively. The upper select output lines (UPDCSEL(7:0)) 140 and the lower select output lines (LPDCSEL(7:4)) 142 are activated to read the plurality of storage locations within the address CAM circuits 54.

As previously set forth, redundant blocks (b4–b7) 18 can be located in the upper bank 20 or the sliding lower bank 22 depending on the fabrication of the simultaneous operation flash memory 10. NAND gates 120–126 are associated with redundant blocks (b4–b7) 18 if they are located in the upper bank 20. NAND gates 128–134 are associated with redundant blocks (b4–b7) 18 if they are located in the sliding lower bank 22. The determination of which group of NAND gates 120–134 represents redundant blocks (b4–b7) 18 is determined by the configuration of the bank boundary select 68. The bank boundary select 68 determines whether the upper select output lines UPDCSEL(7:4) 140 or the lower select output lines LPDCSEL(7:4) 142 provide output signals.

For example, when option two is selected, redundant block (b7) 18 is located in the sliding lower bank 22 and the bank boundary select 68 supplies a non-conducting electrical signal to NAND gate 126 and a conducting electrical signal to NAND gate 134. In this configuration, NAND gate 126 will be deactivated and therefore will not provide an output signal on respective upper select output line (UPDCSEL(7)) 140. On the other hand, NAND gate 134 will provide an output signal on respective lower select output line (LPDCSEL(7)) 142 when the LAB address inputs 152, 154 and 156, representing redundant block (b7) 18, are decoded by the redundancy CAM read drain decoder circuit 50.

During operation, the redundancy CAM read drain decoder circuit 50 could receive the redundant block address of one of the redundant blocks (b0–b7) 18 located in the upper bank 20 or in the sliding lower bank 22. Since the banks 20, 22 are capable of independent operation, the redundancy CAM read drain decoder circuit 50 can control the address CAM circuits 54 assigned to different banks 20, 22. The address CAM circuits 54 are configurably assigned to different banks 20, 22, by the redundancy CAM read drain decoder circuit 50 to repair columns of memory cells 26 that contain defects during simultaneous operation.

To ensure no conflicts occur, a conducting electric signal is generated on an upper enable line (UREDEN) 64 from NAND gate 136 when an output signal is generated on upper select output lines (UPDSEL(7:4)) 140. Similarly, a conducting electric signal is generated on a lower enable line (LREDEN) 66 from NAND gate 138 when an output signal is generated on the lower select output lines (LPDCSEL (7:4)) 142. If the redundant block address lines ((A20)–(A18)) 24 are being decoded for redundant block (b0) 18 in the upper bank 20, for example, the output of the upper enable line (UREDEN) 64 is conducting. The conducting upper enable line (UREDEN) 64 enables the upper bank comparator circuits 56 that is hereinafter described.

Repair Select Decoder Circuit

Figure 6:
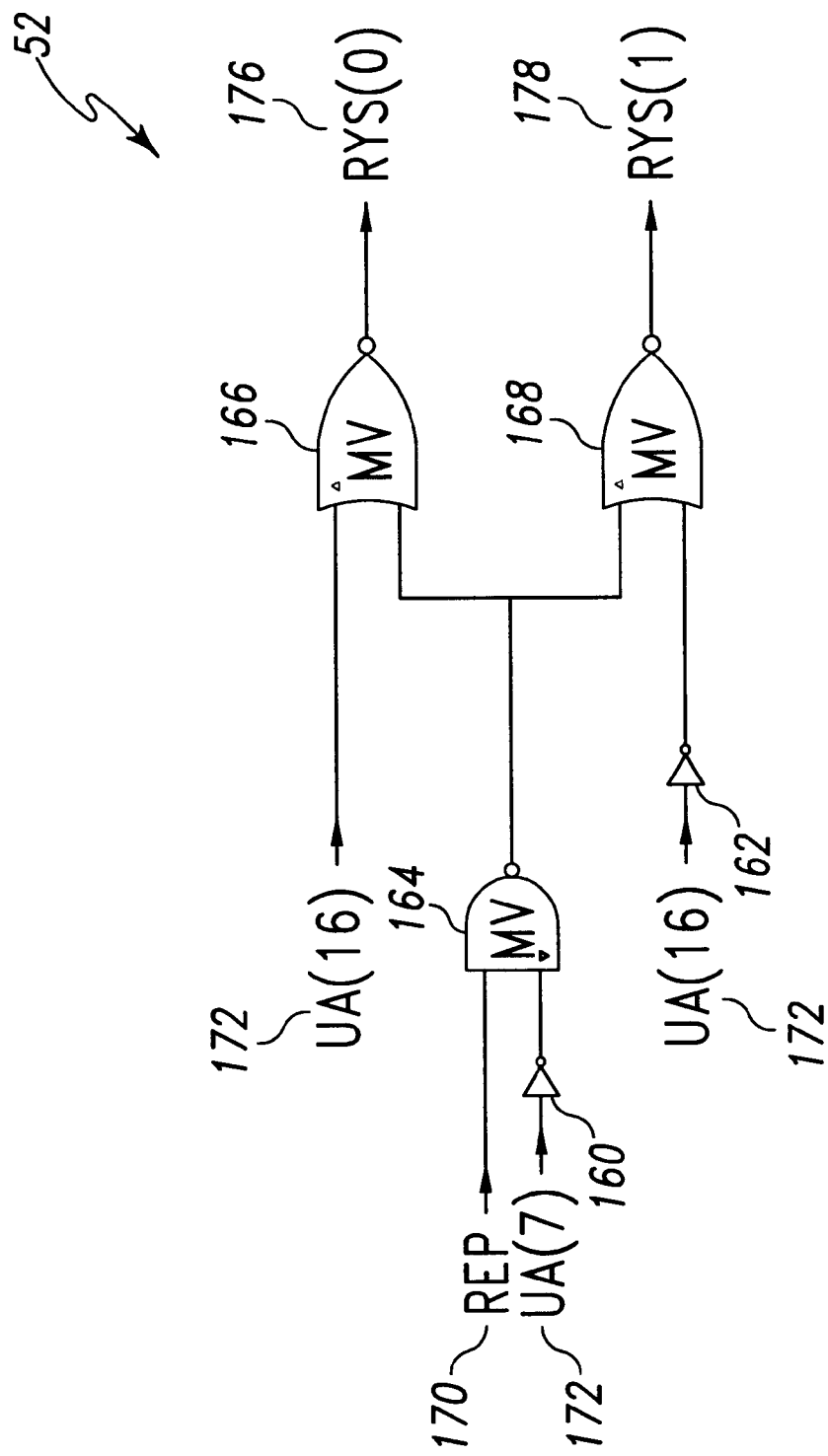
FIG. 6 is a schematic diagram of the repair select decoder circuit illustrated in FIG. 4.

FIG. 6 is a circuit schematic of the presently preferred repair select decoder circuit 52 that includes a plurality of inverters 160–162, a NAND gate 164, and a plurality of NOR gates 166–168 electrically connected as illustrated. The repair select decoder circuit 52 is activated when a user enters a repair mode. The user selects which redundant element 36, 38 will be used to make the repair using the repair select decoder circuit 52.

The repair select decoder circuit 52 is activated by an input signal on a repair line (REP) 170 when the simultaneous operation flash memory 10 is placed in the repair mode. A respective set of address lines (UA (7), UA (16)) 172 generate electric signals on either a first redundant output line (RYS(0)) 176 or a second redundant output line (RYS(1)) 178. A conducting electrical signal on the first redundant output line (RYS(0)) 176 or the second redundant output line RYS(1) 178 enables the first redundant element (RE0) 36 or the second redundant element (RE1) 38, respectively, to be programmed during the repair mode. As previously set forth, the first redundant element (RE0) 36 and the second redundant element (RE1) 38 are assigned to the storage locations within the address CAM circuits 54. The selection of the redundant element 36, 38 that will be used to make the repair designates the storage location of the sector-based address of the column of memory cells 26 that is defective.

Address CAM Circuits

Figure 7A:
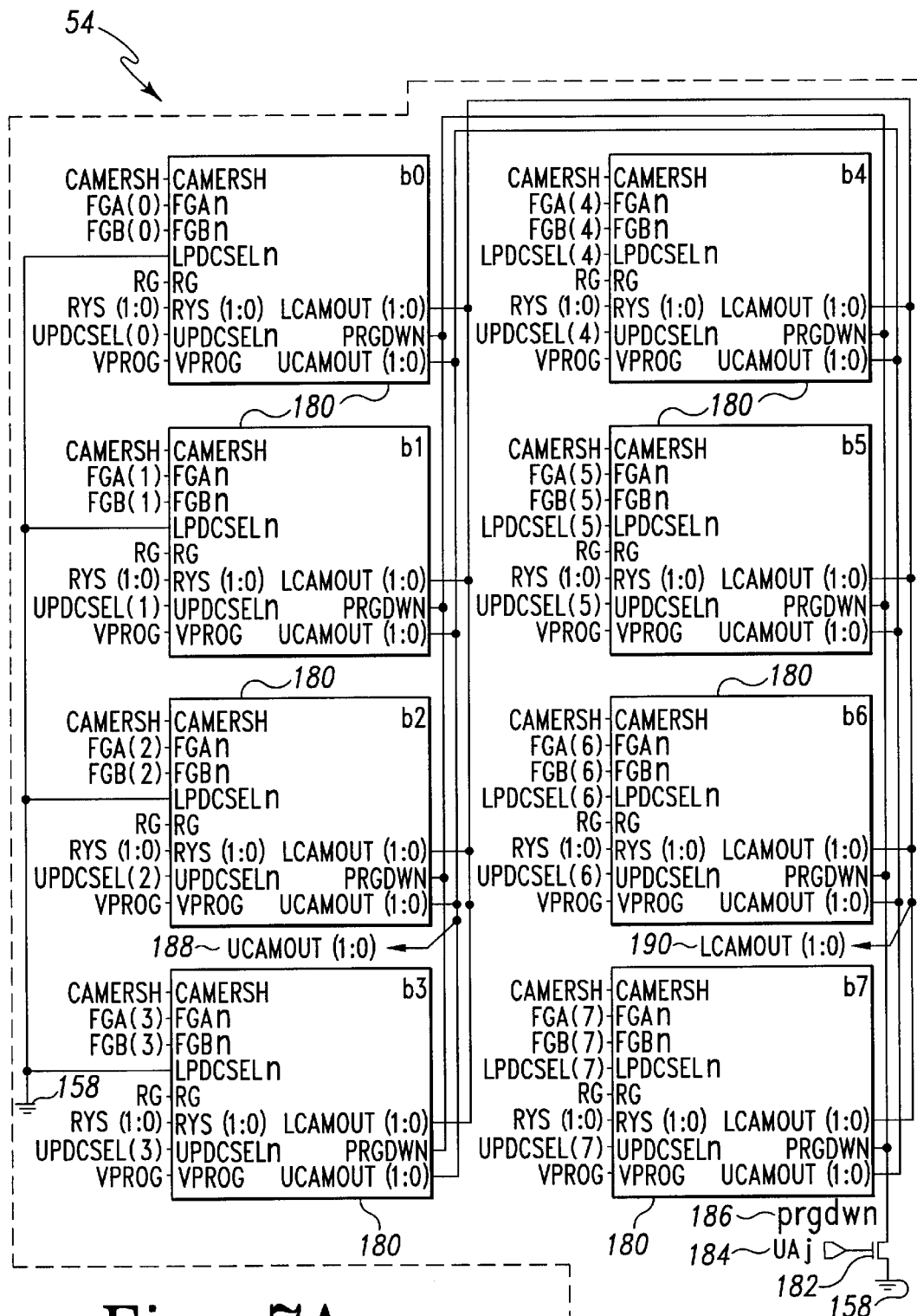
FIG. 7A is a block diagram of the address CAM circuit illustrated in FIG. 4.

FIG. 7A illustrates a schematic of the presently preferred address CAM circuits 54. The address CAM circuits 54 include a plurality of mini-CAM circuits (b0–b7) 180 and an n-channel transistor 182. The mini-CAM circuits (b0–b7) 180, are electrically connected with the transistor 182 as illustrated. In the presently preferred embodiment, there are seven address CAM circuits 54.

The mini-CAM circuits (b0–b7) 180, each store a bit of the sector-based addresses of columns of memory cells 26 that contain defects. The sector-based address information that identifies a particular column of memory cells 26 that is defective is contained in seven bits. The bits are stored in all seven address CAM circuits 54 such that there is one bit stored in each address CAM circuit 54. The number of bits, and therefore address CAM circuits 54 is a function of the number of columns of memory cells 26 in the sectors 12. Each mini-CAM circuit (b0–b7) 180, is assigned to a respective redundant block (b0–b7) 18. If the column of memory cells 26 that contains the defect is in redundant block (b4) 18, for example, the bits of the sector-based address for the column of defective memory cells will be stored in mini-CAM circuit (b4) 180.

The mini-CAM circuits (b0–b7) 180 are programmed by activating n-channel transistor 182 with an address line (UAj) 184. The address line (UAj) 184 represents each bit of the sector-based address (j=0–5) of a column of memory cells 26 that contains defects. The bit to be programmed is identified by the user and the corresponding address line (UAj) 184 is activated. Activation of the address line (UAj) 184 electrically connects a program input line (PRGDWN) 186 with the ground connection 158. The program input line (PRGDWN) 186 is electrically connected to the mini-CAM circuits (b0–b7) 180 as illustrated in FIG. 7A.

Each respective mini-CAM circuit (b0–b7) 180 contains two storage locations (not shown) that are assigned to the first redundant element (RE0) 36 or the second redundant element (RE1) 38. As previously set forth, the redundant element 36, 38 that repairs the column of memory cells 26 that contains defects is designated by the repair select decoder circuit 52 during programming. This designation identifies which of the two storage locations within each of the mini-CAM circuits (b0–b7) 180 will be programmed with the sector-based address of the column of memory cells 26 that contains defects.

The address information identifying a column of memory cells 26 that is defective is stored in the seven address CAM circuits 54, and consists of a high-byte or low-byte identifier, a sector-based column address, and an enable. The first address CAM circuit 54 stores information relating to whether the column of defective memory cells is in the low byte (i.e. I/O 0–7) or in the high byte (i.e. I/O 8–15). When read during operation, the first address CAM circuit 54 provides an electric signal on a first upper CAM output line (UCAMOUT0(0)) 188 and a second upper CAM output line (UCAMOUT0(1)) 188 or on a first lower CAM output line (LCAMOUT0(0)) 190 and a second lower CAM output line (LCAMOUT0(1)) 190.

The respective electric signals will conduct if the stored sector-based address of the column of memory cells 26 that is defective is designated as the high byte.

The first upper CAM output line (UCAMOUT0(0)) 188 and the second upper CAM output line (UCAMOUT0(1)) 188 are representative of the first redundant element (RE0) 36 and the second redundant element (RE1) 38, respectively, in the mini CAM circuits (b0–b7) 180. For purposes of brevity, the remainder of this discussion will refer to circuits and operation with the designation (1:0) to represent the first redundant element (RE0) 36 and the second redundant element (RE1) 38, respectively. The reader should recognize that the designation of the redundant element 36, 38 is chosen during programming, and therefore, representative lines designated with (1:0) represent lines for both redundant elements 36, 38.

When read during operation, the second through sixth address CAM circuits 54 each provide an electric signal on a first upper CAM output line (UCAMOUT(1:0)) 188 or on a first lower CAM output line (LCAMOUT(1:0)) 190. The respective electric signals on the respective upper and lower CAM output lines 188, 190 of the second through sixth addresses CAM circuits 54 are the bits of the stored sector-based addresses of the columns of memory cells 26 that are defective. The most significant bit of the sector-based column address is stored in the second address CAM circuit 54 and the least significant bit of the sector-based column address is stored in the sixth address CAM circuit 54.

The seventh address CAM circuit 54 is programmed during the repair mode to indicate that the second through sixth address CAM circuits 54 have been programmed with the sector-based address of a column of memory cells 26 that is defective. When read during operation, the seventh address CAM circuit 54 provides a conducting electric signal on a first upper CAM output line (UCAMOUT6(1:0)) 188 or on a first lower CAM output line (LCAMOUT6(1:0)) 190 when programmed. It should be noted that n-channel transistor 182 of the seventh address CAM circuit 54 is always activated to allow programming of the respective mini-CAM circuits (b0–b7) 180.

Figure 7B:
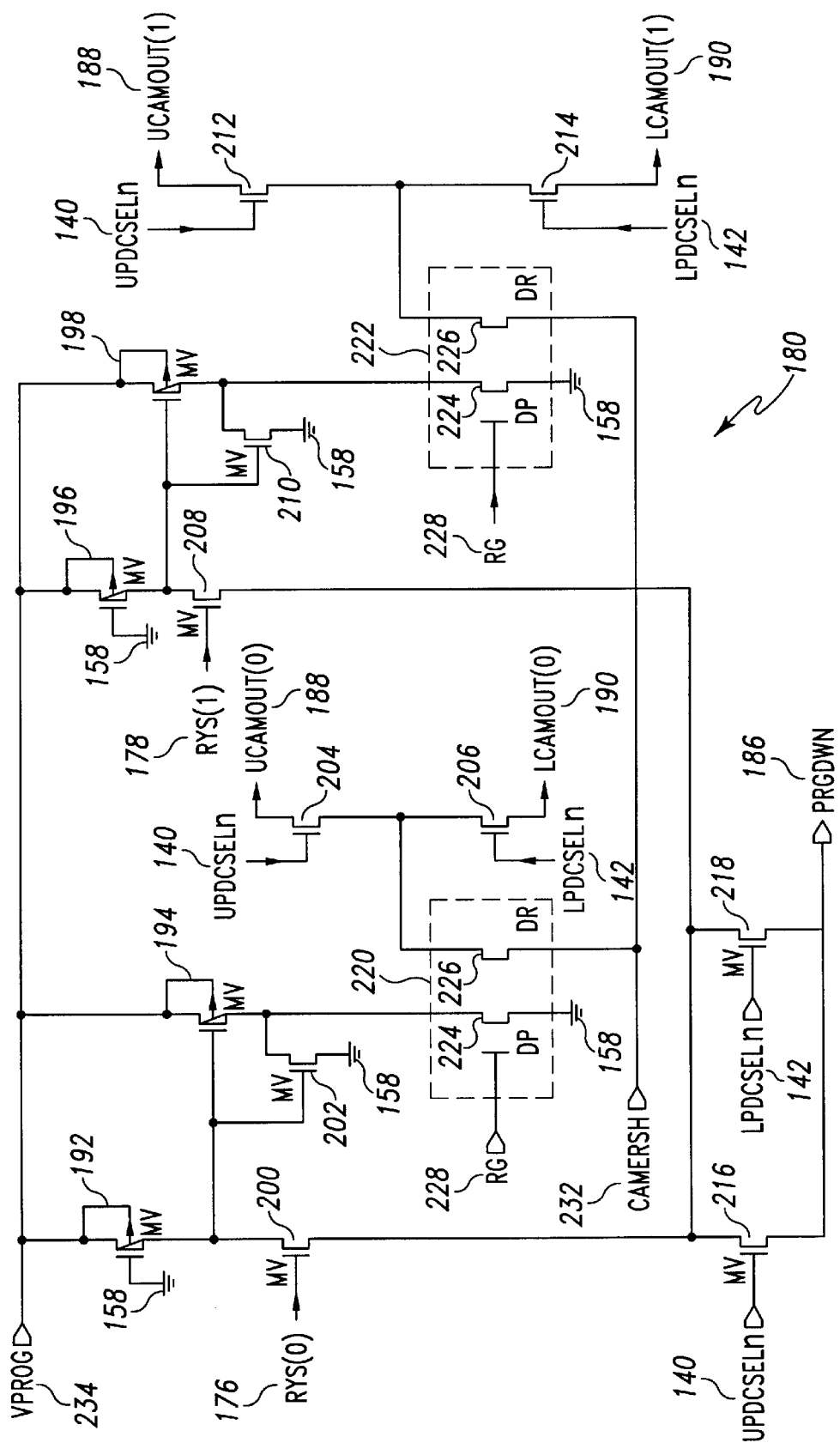
FIG. 7B is a schematic diagram of a mini-CAM circuit that forms a part of the address CAM circuit of FIG. 7A.

FIG. 7B illustrates a circuit schematic of the preferred mini-CAM circuit (b0–b7) 180. The mini-CAM circuit (b0–b7) 180 includes a plurality of p-channel enhancement transistors 192–198, a plurality of n-channel transistors 200–218, and a plurality CAM cells 220, 222 which are electrically connected as illustrated. The mini-CAM circuits (b0–b7) 180 operate during a redundant CAM erase mode, during the repair mode and during operation of the simultaneous operation flash memory 10.

The mini-CAM circuit 180 includes two CAM cells 220, 222 that are double poly transistors. The CAM cells 220, 222 include a program device 224 and a read device 226. The program device 224 is a core-type flash transistor and the read device 226 is basically an intrinsic transistor, except that its poly-1 is connected to the poly-1 of the program device 224. As such, when the program device 224 is programmed, the read device 226 is also programmed since its poly-1 is charged. The poly-2 layer forms the control gate of each of the program devices 224 that are electrically connected to a redundant gate line (RG) 228. The source of the program device 224 is electrically connected with the ground connection 158, and the source of the read device 226 is electrically connected with a CAM erase line (CAMERSH) 232 to allow the CAM cells 220, 222 to be erased.

During operation, the redundant gate line (RG) 228 directs predetermined voltages to the gate of the program device 224 during reading, programming or erasing. The CAM erase line (CAMERSH) 232 directs predetermined voltages to the source of the read device 226 during an erase operation. The generation of the predetermined voltages on the redundant gate line (RG) 228 and the CAM erase line (CAMERSH) 232 are known in the art.

The CAM cells 220, 222 can be erased during a redundant CAM erase mode. During the redundant CAM erase mode, the user specifies which mini-CAM circuit (b0–b7) 180 is to be erased. A predetermined negative erasing voltage is pulsed on the redundant gate line (RG) 228 of the specified mini-CAM circuit (b0–b7) 180. In addition, a predetermined positive voltage is provided on the CAM erase line (CAMERSH) 232 of the specified mini-CAM circuit (b0–b7) 180. In the presently preferred embodiment, the predetermined negative erasing voltage is about −9.0 v.

The mini-CAM circuits (b0–b7) 180 are programmed during the repair mode. During programming, the redundancy CAM read drain decoder circuit 50 receives and decodes the redundant block address where the column of memory cells 26 that is defective is located and generates a respective output signal on the upper select output lines (UPDCSEL(7:0)) 140 or the lower select output lines (LPDCSEL(7:4)) 142 as previously set forth. Upper select output lines (UPDCSEL(7:4)) 140 and the lower select output lines (LPDCSEL(7:4)) 142 are electrically connected with mini-CAM circuits (b4–b7) 180, respectively. In addition, upper select output lines (UPDCSEL(3:0)) 140 are electrically connected with mini-CAM circuits (b0–b3) 180, respectively.

During programming of mini-CAM circuits (b4–b7) 180, n-channel transistors 216, 218 are activated when predetermined signals are applied to upper select output lines (UPDCSEL(7:4)) 140 or the lower select output lines (LPDCSEL(7:4)) 142. N-channel transistors 216, 218 function to electrically connect mini-CAM circuits (b4–b7) 180 with the program input line (PRGDWN) 186. As previously set forth, the program input line (PRGDWN) 186 is electrically connected with the ground connection 158 when n-channel transistor 182 of the address CAM circuits 54 is activated with the address line (UAj) 184. In addition, as previously set forth, the repair select decoder circuit 52 generates a conducting electric signal on the first redundant output line (RYS(0)) 176 or the second redundant output line (RYS(1)) 178 to designate the redundant element 36, 38 selected to be programmed during the repair mode. The first redundant output line (RYS(0)) 176 or the second redundant output line (RYS(1)) 178 activates n-channel transistor 200 or n-channel transistor 208, respectively.

When n-channel transistors 200 or 208 are activated, the respective p-channel enhancement transistor 194 or 198 is activated to pass a regulated programming voltage from a program voltage line (VPROG) 234 to the respective CAM cell 220, 222. The redundant gate line (RG) 228 is simultaneously raised to a predetermined programming voltage. The respective program device 224 that is assigned to the first redundant element (RE0) 36, or the respective program device 224 that is assigned to the second redundant element (RE1) 38, is thereby programmed with a bit of the address information for a column of memory cells 26 that is defective.

During operation, the mini-CAM circuits (b0–b7) 180 are read whenever the sector-based address of an active column of memory cells is decoded by the simultaneous operation flash memory 10. As previously set forth, the redundancy CAM read drain decoder circuit 50 receives and decodes the redundant block address that is part of the twenty-one bit address of the active column of memory cells. The redundancy CAM read drain decoder circuit 50 generates a conducting electric signal on one of the respective upper select output lines (UPDCSEL(7:0)) 140, or the lower select output lines (LPDCSEL(7:4)) 142. The upper and lower select output lines 140, 142 identify the bank 20, 22 where the redundant block (b0–b7) 18 is located that contains the active column of memory cells as previously set forth.

The conducting electric signal from the redundancy CAM read drain decoder circuit 50 activates the respective mini-CAM circuits (b0–b7) 180 that are assigned to the respective redundant blocks (b0–b7) 18. If, for example, redundant block (b4) 18 is the location of the active column of memory cells, and redundant block (b4) 18 is in the upper bank 20, mini-CAM circuit (b4) 180 is activated. Mini-CAM circuit (b4) 180 is activated by a conducting electric signal on upper select output line (UPDCSEL(4)) 140. Lower select output line (LPDCSEL(4)) 140 is always non-conducting. Since only upper select output line (UPDCSEL(4)) 140 is conducting, only the first upper CAM output line (UCAMOUT(1:0)) 188 provides data from mini-CAM circuit (b4) 180. No conflict between the banks 20, 22 occurs since lower select output line (LPDCSEL(4)) 140 is always non-conducting.

When the mini-CAM circuits (b0–b7) 180 are read, n-channel transistors 204, 212 or n-channel transistors 206, 214 may be activated, depending on the chosen bank 20, 22. N-channel transistors 204, 212 are upper bank read select transistors and n-channel transistors 206, 214 are lower bank read select transistors. The lower bank read select transistors 206 and 214 are activated when the respective lower output select lines (LPDCSEL(7:4)) 142 are conducting to indicate that the redundant block (b0–b7) 18 is in the sliding lower bank 22. Conversely, the n-channel transistors 204 and 212 are activated when the output on the respective upper sector select lines (UPDCSEL(7:0)) 140 are conducting to indicate that the redundant block (b0–b7) 18 is located in the upper bank 20.

As previously set forth, since the upper bank 20 and the sliding lower bank 22 operate with "two-way" redundancy, mini-CAM circuits (b0–b7) 180 that represent redundant blocks (b0–b7) 18 in different banks 20, 22, can be read during simultaneous operation of the flash memory 10. In addition, the CAM cells 220, 222 are assigned to the first redundant elements (RE0) 36 and the second redundant elements (RE1) 38, respectively. As such, when a mini-CAM circuit (b0–b7) 180 is read, the data stored in CAM cell 220 is assigned to the first redundant element (RE0) 36 and the data stored in CAM cell 222 is assigned to the second redundant element (RE1) 38. Therefore, CAM cell 220 in each of the mini-CAM circuits (b0–b7) 180 provides address information on the first upper CAM output lines (UCAMOUT(0)) 188 or the first lower CAM output lines (LCAMOUT(0)) 190 from each of the address CAM circuits 54. It should be noted by the reader that the first and second designation (1:0) is used to illustrate that there are two electric signals on two different lines representing the first redundant element (RE0) 36 and the second redundant element (RE1) 38. The upper CAM output lines (UCAMOUT(1:0)) 188 and the lower CAM output lines (LCAMOUT(1:0)) 190 are electrically connected with the upper and lower bank comparator circuits 56, 58, respectively.

Upper and Lower Bank Comparator Circuits

Referring again to FIG. 4, the upper bank comparator circuits 56 and the lower bank comparator circuits 58 used in the presently preferred embodiments are identical. For a detailed discussion of the basic circuit operation and configuration, refer to the parity circuit disclosed in U.S. Pat. No. 5,349,558 entitled "SECTOR-BASED REDUNDANCY ARCHITECTURE," to Cleveland. With the exception that the reference current signal (REFBIAS) used in the Cleveland patent to create a reference current to read the mini-CAM circuits has been replaced by a connection to ground (not shown). The reference current in the preferred embodiment is continuously available and thus allows the mini-CAM circuits (b0–b7) 180 to be read. As known in the art, power dissipation is minimized by creating a predetermined r/c characteristic that will minimize the reference current flow from the supply voltage (Vcc). In addition, in the presently preferred embodiment, there are two upper and two lower bank comparator circuits 56, 58 that are respectively electrically connected with a respective address CAM circuit 54 by the respective upper and lower CAM output lines 188, 190.

Referring once again to FIG. 4, the upper and lower bank comparator circuits 56, 58 are respectively active during operation when a read or a write is performed on the upper bank 20 or the sliding lower bank 22, respectively. During a read or write, a plurality of upper comparator circuit address lines (UAA (5:1)) 57 or lower comparator circuit address lines (LAA (5:1)) 59, provide electrical signals representing the sector-based address of an active column of memory cells. The designation (5:1) indicates that the sector-based address of the active column of memory cells comprise 5 bits on 5 signal lines.

The sector-based address of the active column of memory cells is supplied from the address buffer to the upper or lower bank comparator circuits 56, 58. In addition, electrical signals representing the previously stored address information in each of the address CAM circuits 54 are supplied to the upper or lower bank comparator circuits 56, 58 by either the upper CAM output lines (UCAMOUT(1:0)) 188 or the lower CAM output lines (LCAMOUT(1:0)) 190, respectively. The individual bits of the sector-based address of the previously stored column of memory cells 26 that is defective, and the sector-based address of the active column of memory cells, are then compared.

In the presently preferred embodiment, since there are seven bits of binary data stored within the address CAM circuits 54, all seven address CAM circuits 54 and fourteen upper bank comparator circuits 56 or lower bank comparator circuits 58 are used simultaneously during the comparison of the sector-based addresses. Further, since the stored address of the column of memory cells 26 that is defective is five address bits, the remaining upper or lower comparator circuits 56, 58 and respective address CAM circuits 54 decode the high-byte or low-byte identifier and the enable, as previously set forth.

The electric signal representing the high-byte or low-byte identifier on the upper CAM output lines (UCAMOUT0 (1:0)) 188 or the lower CAM output lines (LCAMOUT0 (1:0)) 190 are compared by the respective upper or lower bank comparator circuits 56, 58 to an always conducting (logic "1") electric signal. The electric signal representing the enable on the upper CAM output lines (UCAMOUT6 (1:0)) 188 or the lower CAM output lines (LCAMOUT6 (1:0)) 190 are compared by the respective upper and lower bank comparator circuits 56, 58 to an electric signal on the upper enable line (UREDEN) 64 or the lower enable line (LREDEN) 66, respectively. As previously set forth, upper and lower enable lines 64, 66 are electrically connected with the redundancy CAM read drain decoder circuit 50. A conducting electrical signal on the upper enable line (UREDEN) 64 or the lower enable line (LREDEN) 66 indicates that a redundant block address for the upper bank 20 or the sliding lower bank 22, respectively, are being decoded by the redundancy CAM read drain decoder circuit 50.

When the sector-based addresses of the previously stored column of memory cells 26 that is defective and the active column of memory cells match, the upper or lower bank comparator circuits 56, 58 provide a plurality of electric signals to the respective upper or lower bank control logic circuits 60, 62. The plurality of electric signals are generated on an address match output line (YCOM) 236, an enable output line (YCE) 237 and a high-byte output line (HIBYTE) 238.

In the presently preferred embodiment, five upper or lower bank comparator circuits 56, 58 each compare a bit of the sector-based addresses and generate the plurality of electric signals on the respective signal lines. The signal lines are designated with a "U" and an "L" to identify the upper bank 20 and the sliding lower bank 22, respectively, as illustrated in FIG. 4. For purposes of brevity, the focus of the discussion will be on the upper bank 20. In addition, the plurality of electric signals from the upper bank comparator circuits 56 also designate the first redundant element (RE0) 36 and the second redundant element (RE1) 38. As previously set forth, the designation (1:0) is representative of signals associated with the first redundant element (RE0) 36 and the second redundant element (RE1) 38.

During operation, when the upper bank comparator circuits 56 have compared and matched the bits of the sector based addresses, the upper address match output line (UYCOM(1:0)) 236 begins conducting. In addition, the upper bank comparator circuit 56 generates a conducting electric signal on the upper enable output line (UYCE(1:0)) 237. Further, the upper bank comparator circuit 56 generates a conducting electric signal on the upper high-byte output line (UHIBYTE(1:0)) 238 if the column of memory cells 26 that is defective are in the high byte. As previously set forth, the column of memory cells 26 that is defective can be located in the high byte or the low byte. The plurality of output signals from the upper or lower bank comparator circuits 56, 58 are directed to a plurality of redundant predecoder circuits, included in the upper bank control logic circuits 60, 62.

Upper and Lower Bank Control Logic Circuits

Figure 8A:
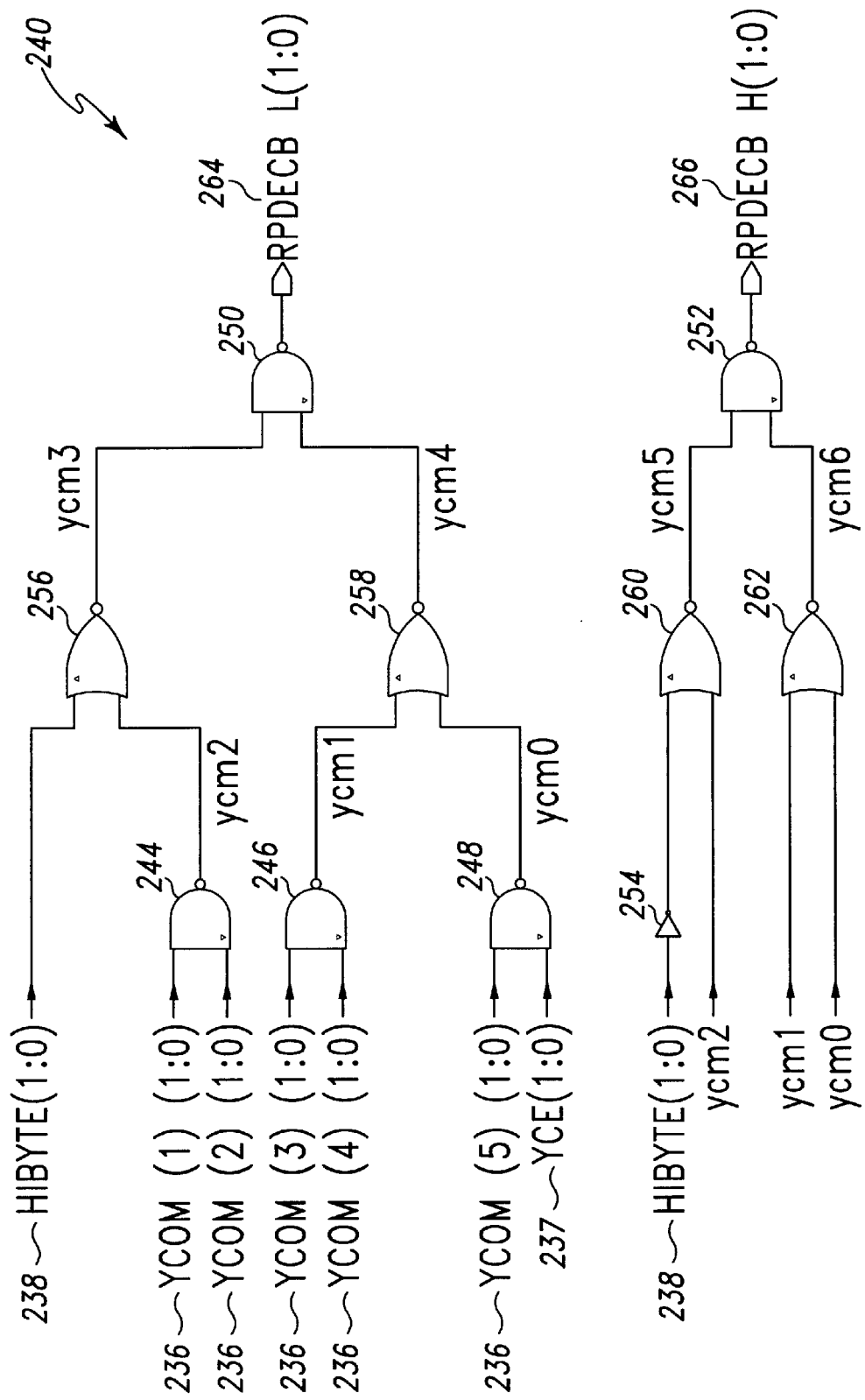
FIG. 8A is a schematic diagram of a redundancy predecoder that forms a part of the bank control logic circuit of FIG. 8B.

FIG. 8A is a circuit schematic of a preferred redundant predecoder circuit zero (redpredec0) 240 or a redundant predecoder circuit one (redpredec1) 242. The redundant predecoder circuit zero (redpredec0) 240 is the same as the redundant predecoder circuit one (redpredec1) 242. The redundant predecoder circuit zero and one 240, 242 are representative of the first redundant element (RE0) 36 and the second redundant element (RE1) 38, respectively, in the upper and lower bank control logic circuits 60, 62. Therefore, for purposes of brevity, a redundant predecoder circuit (redpredec) representative of the redundant predecoder circuit zero (redpredec0) 240 and the redundant predecoder circuit one (redpredec1) 242 will be discussed. In addition, operation of the redundant predecoder circuit (redpredec) is disclosed for operation with respect to only the upper bank 20 since operation in the lower bank is the same.

The presently preferred redundant predecoder circuit (redpredec) includes a plurality of NAND gates 244–252, an inverter 254; and a plurality of NOR gates 256–262 electrically connected as illustrated in FIG. 8A. As previously set forth, when activated, the upper bank control logic circuits 60 disable the UA bitline decoders (not shown) that are attempting to decode the byte containing the column of memory cells 26 that is defective in the upper bank 20 and activate the redundant UA bitline decoders (not shown). The redundant UA bitline decoders activate the byte that is the redundant element 36, 38 containing the columns of redundant memory cells 34. The redundant predecoder circuit (redpredec) is activated by electric signals on the upper high-byte output lines (UHIBYTE(1:0)) 238, each of the first through the fifth address match output lines (UYCOM (1:0)) 236 and the upper enable output lines (UYCE(1:0)) 237 from the upper bank comparator circuits 56.

As previously set forth, the upper enable output lines (UYCE(1:0)) 237 and the first through the fifth upper address match output lines (UYCOM(1:0)) 236 are conducting (logic "1") when the addresses match. The conducting electric signals indicate that the sector-based address of the active column of memory cells was identified during testing as a column of memory cells 26 that is defective and was repaired by the first redundant element (RE0) 36 or the second redundant element (RE1) 38. The electric signals on the upper high byte output lines UHIBYTE(1:0) 238 designate whether the byte containing the column of memory cells 26 that is defective is the high byte or the low byte. As previously set forth, since the redundant elements 36, 38 only contain eight bits (metal2), one redundant element 36, 38 is designated to replace either the high byte or the low byte within the sector 12.

In the presently preferred embodiment, the redundant predecoder circuit (redpredec) provides electric signals on a repair decoder low-byte output line (RPDECBL(1:0)) 264 and on a repair decoder high-byte output line (RPDECBH (1:0)) 266. The repair decoder high and low byte output lines 264, 266 are normally conducting (logic "1") and will become non-conducting (logic "0") to indicate that the byte to be repaired is a high byte or a low byte, respectively. When the repair decoder low-byte output line (RPDECBL (1:0)) 264 stops conducting, a low byte is repaired, and conversely, when the repair decoder high-byte output line (RPDECBH(1:0)) 266 stops conducting, a high byte is repaired.

Figure 8B:
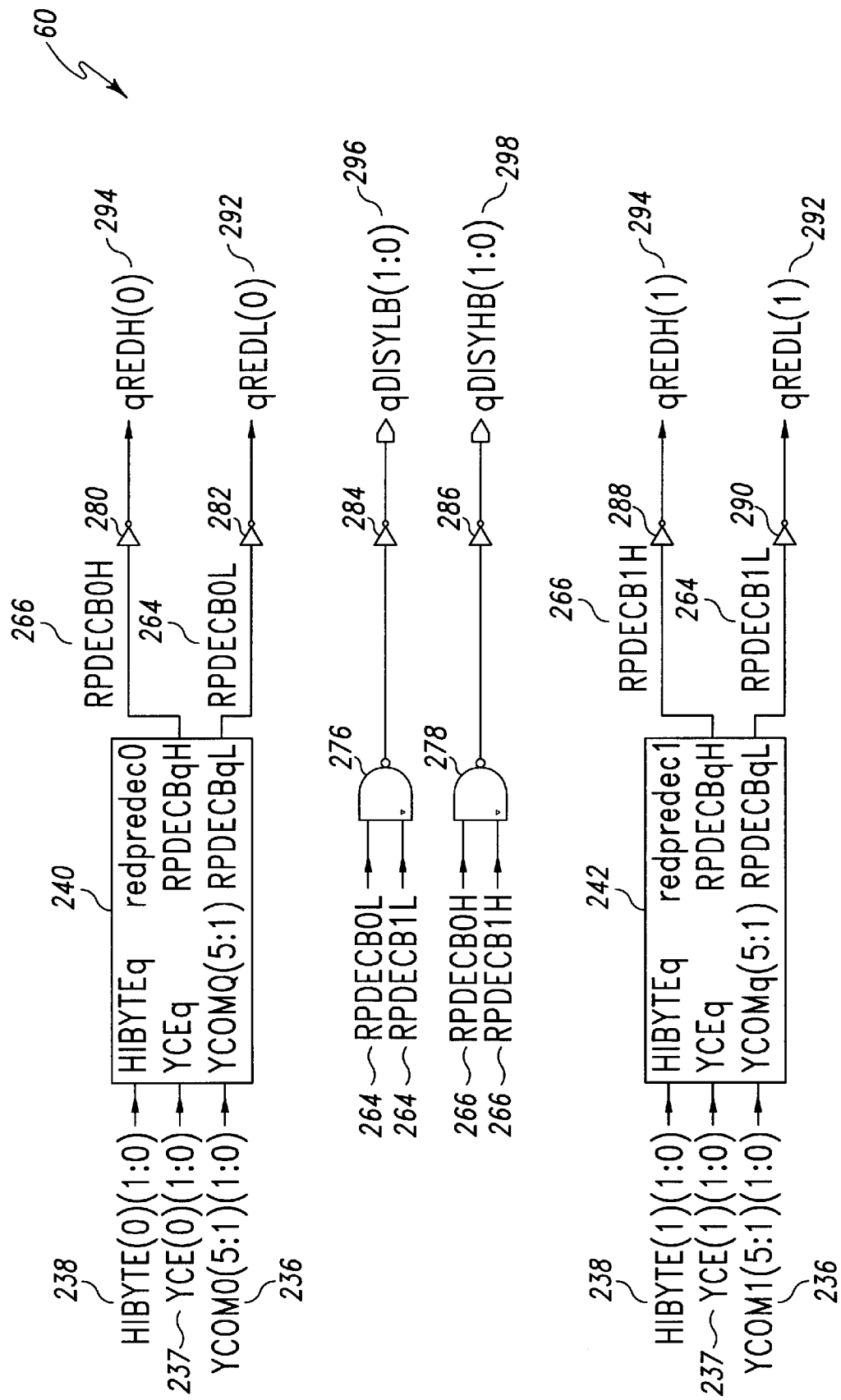
FIG. 8B is a schematic diagram of the bank control logic circuit illustrated in FIG. 4.

FIG. 8B is a circuit schematic of the presently preferred upper or lower bank control logic circuits 60, that include the redundant predecoder circuit zero (redpredec0) 240 and the redundant predecoder circuit one (redpredec1) 242 previously set forth. In addition, the upper or lower bank control logic circuits 60, 62 include a plurality of NAND gates 276–278 and a plurality of inverters 280–290 that are electrically connected as illustrated in FIG. 8B. The lower bank control logic circuits 62 are the same as the upper bank control logic circuits 60 and, therefore, it will only be necessary to describe the upper bank control logic circuits 60.

The presently preferred upper bank control logic circuits 60 disable the UA bitline decoders (not shown) that decode the column of memory cells 26 that is defective. The UA bitline decoders are disabled with an electric signal on a disable low-byte address output line (DISYLB(1:0)) 296 or on a disable high-byte address output line (DISYHB(1:0)) 298 from the redundant predecoder circuit zero (redpredec0) 240 or the redundant predecoder circuit one (redpredec1) 242, respectively. When the repair decoder low-byte output line (RPDECBL(1:0)) 264 stops conducting, the disable low-byte address output line (DISYLB(1:0)) 296 is non-conducting thereby disabling the low byte of the UA bitline decoders from decoding the byte that includes the column of memory cells 26 that is defective. Similarly, if the electric signal on the repair decoder high-byte output lines (RPDECBH(1:0)) 266 stops conducting, the disable high-byte address output lines (DISYHB(1:0)) 298 will disable the high byte of the UA bitline decoders from decoding the byte containing the column of memory cells 26 that is defective.

In addition, when the repair decoder high-byte output lines (RPDECBH(1:0)) 266 is non-conducting, a respective redundant high-byte line (REDH(1:0)) 294 begins conducting to enable the redundant UA bitline decoder to decode the redundant element 36, 38 designated to make the repair. The same logic occurs when the repair decoder low-byte output lines (RPDECBL(1:0)) 264 is non-conducting (logic "0") and a respective redundant low-byte line (REDL (1:0)) 292 begins conducting.

The presently preferred simultaneous operation flash memory 10 includes "two-way" sector-based redundancy that allows repairs to occur at the same time in both the upper bank 20 and the sliding lower bank 22 during simultaneous operation.

The configurably located redundant blocks (b0–b7) 18, are associated with storage locations in the address CAM circuits 54 that are configurable by the redundancy CAM read drain decoder circuit 50 based on the bank location of the redundant blocks (b0–b7) 18. Since the storage locations are configurable, no additional storage locations are required to account for the different possible bank locations of the redundant blocks (b0–b7) 18. In addition, the redundancy CAM read drain decoder circuit 50 provides dual address decoding for the address CAM circuits 54 to allow separate operation in the upper bank 20 and the sliding lower bank 22. Duplicate sector-based redundancy circuits in the upper and sliding lower banks 20, 22 provide independent operation of the sector-based redundancy in the upper bank 20 and the sliding lower bank 22 to minimize delay during simultaneous operation.

It is, therefore, intended that the foregoing detailed description be regarded as illustrative rather than limiting, and that it be understood that it is the following claims, including all equivalents, which are intended to define the spirit and scope of this invention.

What is claimed is:

1. A dual bank address storage system for sector-based redundancy in a dual bank simultaneous operation memory device that includes an upper bank and a sliding lower bank, comprising:
    a plurality of redundant blocks configurably located within said upper bank and said sliding lower bank, wherein said redundant blocks comprise separate memory cells used as spare memory;
    a plurality of address CAM circuits assigned to said redundant blocks for storing a plurality of sector-based addresses; and
    a redundancy CAM read drain decoder circuit electrically connected with said address CAM circuits for reading and programming said address CAM circuits with said sector-based addresses, wherein said address CAM circuits are readable by said redundancy CAM read drain decoder circuit during simultaneous operations in said upper bank and said sliding lower bank.

2. The dual bank address storage system of claim 1, wherein said address CAM circuits include a plurality of storage locations that are configurably associated with said upper bank and said sliding lower bank by said redundancy CAM read drain decoder circuit.

3. The dual bank address storage system of claim 2, wherein said storage locations are configured based on a bank location of said redundant blocks that are associated with said storage locations.

4. The dual bank address storage system of claim 1, wherein said address CAM circuits assigned to said redundant blocks configurably located in said upper bank are read to make a repair in said upper bank and said address CAM circuits assigned to said redundant blocks configurably located in said sliding lower bank are read to make a repair in said sliding lower bank.

5. The dual bank address storage system of claim 1, wherein a plurality of storage locations included within said address CAM circuits are read by said redundancy CAM read drain decoder circuit based on a bank location of one of said redundant blocks that are currently being accessed.

6. The dual bank address storage system of claim 1, wherein configuration of said redundancy CAM read drain decoder circuit is based on said redundant blocks located in said upper bank and said sliding lower bank.

7. The dual bank address storage system of claim 1, wherein said address CAM circuits include a plurality of mini-CAM circuits.

8. The dual bank address storage system of claim 7, wherein each of said mini-CAM circuits include at least two storage locations.

9. The dual bank address storage system of claim 7, wherein said mini-CAM circuits can be erased.

10. A dual bank simultaneous operation memory device with sector-based redundancy having a plurality of sectors that are located in a plurality of redundant blocks that include columns of memory cells and redundant columns of memory cells, said redundant blocks are configurably located in an upper bank and a sliding lower bank, said dual bank simultaneous operation memory device comprising:
    a redundancy CAM read drain decoder circuit for decoding a bank location of said redundant blocks in said upper bank and said sliding lower bank;
    a plurality of address CAM circuits electrically connected with said redundancy CAM read drain decoder circuit for selectively storing and reading a plurality of sector-based addresses, wherein said address CAM circuits are configurable by said redundancy CAM read drain decoder circuit to be associated with said upper bank and said sliding lower bank;
    a plurality of upper bank comparator circuits electrically connected with said address CAM circuits for comparing said plurality of sector-based addresses with a first sector-based address of a first active column of memory cells located within said upper bank,
    a plurality of lower bank comparator circuits electrically connected with said address CAM circuits for comparing said plurality of sector-based addresses with a second sector-based address of a second active column of memory cells located within said sliding lower bank;
    a plurality of upper bank control logic circuits electrically connected with said upper bank comparator circuits for electrically exchanging at least said first active column of memory cells with at least one redundant column of memory cells located in said upper bank when said first sector-based address matches one of said plurality of sector-based addresses; and
    a plurality of lower bank control logic circuits electrically connected with said lower bank comparator circuits for electrically exchanging at least said second active column of memory cells with at least one redundant column of memory cells located in said sliding lower bank when said second sector-based address matches one of said plurality of sector-based addresses.

11. The dual bank simultaneous operation memory device of claim 10, wherein a plurality of storage locations within said address CAM circuits are configurably associated with said upper bank and said sliding lower bank.

12. The dual bank simultaneous operation memory device of claim 10, wherein said upper bank control logic circuits and said lower bank control logic circuits are operable to electrically exchange said active columns of memory cells with said redundant columns of memory cells in said upper bank and said sliding lower bank during simultaneous operation of said memory device.

13. The dual bank simultaneous operation memory device of claim 10, wherein said address CAM circuits include a plurality of mini-CAM circuits.

14. The dual bank simultaneous operation memory device of claim 13, wherein each of said mini-CAM circuits include at least two address storage locations.

15. The dual bank simultaneous operation memory device of claim 13, wherein said mini-CAM circuits can be erased.

16. The dual bank simultaneous operation memory device of claim 10, wherein said upper bank control logic circuits and said lower bank control logic circuits electrically exchange said at least one active column of memory cells with said at least one redundant column of memory cells by deactivating a respective bitline decoder and activating a respective redundant bitline decoder in said upper and sliding lower banks, respectively.

17. A dual bank simultaneous operation memory device with sector-based redundancy that includes an upper bank and a sliding lower bank, comprising:
- a plurality of redundant blocks configurably located within said upper bank and said sliding lower bank;
- a plurality of columns of memory cells that are located within said redundant blocks;
- a plurality of columns of redundant memory cells that are located within said redundant blocks;
- an address storage means for storing a plurality of sector-based addresses, wherein said address storage means is assigned to said redundant blocks and said columns of redundant memory cells and stores said sector-based addresses to correspond to said upper bank and said sliding lower bank;
- a decoding means electrically connected with said address storage means for selective reading and programming of said address storage means with said sector-based addresses for said redundant blocks located in said upper bank and said sliding lower bank;
- a comparator means electrically connected with said address storage means for comparing said sector-based addresses stored in said address storage means assigned to said redundant blocks located in said upper bank and said sliding lower bank with sector-based addresses of a plurality of active columns of memory cells similarly located in said redundant blocks located in said upper bank and said sliding lower bank; and
- a bank control logic means electrically connected with said bank comparator means for electrically exchanging said active columns of memory cells with said redundant columns of memory cells similarly located in said redundant blocks in said upper bank and said sliding lower bank when said sector-based addresses of said active columns of memory cells match said sector-based addresses stored within said address storage means.

18. The dual bank simultaneous operation memory device of claim 17, wherein said address storage means includes a plurality of storage locations that are configurably associated with said upper bank and said sliding lower bank by said decoder means.

19. The dual bank simultaneous operation memory device of claim 18, wherein said storage locations are configured based on a bank location of said redundant blocks that are associated with said storage locations.

20. The simultaneous operation memory device of claim 17, wherein said bank control logic means are operable to electrically exchange said active columns of memory cells with said redundant columns of memory cells in said upper bank and said sliding lower bank during simultaneous operation of said memory device.

21. The simultaneous operation memory device of claim 17, wherein said address storage means comprises a plurality of mini-CAM circuits that each include at least two storage locations.

22. The simultaneous operation memory device of claim 19, wherein said address storage means can be erased.

23. A method of redundant operation in a dual bank simultaneous operation memory device operable with an upper bank and a sliding lower bank, comprising the acts of:
- identifying sector-based addresses of a plurality of columns of memory cells that are defective in said upper bank and said sliding lower bank;
- storing said sector-based addresses in a plurality of address CAM circuits according to locations of said columns of memory cells that are defective in said upper bank and said sliding lower bank;
- comparing said sector-based addresses stored in said address CAM circuits with sector-based addresses of a plurality of active columns of memory cells located in said upper bank and said sliding lower bank; and
- electrically exchanging said active columns of memory cells with a plurality of redundant columns of memory cells in said upper bank and said sliding lower bank during simultaneous operation of said memory device when said sector-based addresses of said active columns of memory cells match said sector-based addresses stored in said address CAM circuits.

24. The method of claim 23, comprising the additional act of selectively configuring a plurality of storage locations that are included in said address CAM circuits to be associated with said upper bank and said sliding lower bank.

25. The method of claim 23, wherein said address CAM circuits are electrically connected with a redundancy CAM read drain decoder circuit, wherein said redundancy CAM read drain decoder circuit reads and programs said address CAM circuits with said sector-based addresses.

* * * * *